(12) United States Patent
Hiebert et al.

(10) Patent No.: US 7,682,840 B2
(45) Date of Patent: Mar. 23, 2010

(54) MAGNETIC DEVICE AND METHOD OF MAKING THE SAME

(75) Inventors: Wayne Hiebert, Ponoka (CA); Jo De Boeck, St. Katelijne Waver (BE); Liesbet Lagae, Herent (BE); Roel Wirix-Speetjens, Maaseik (BE)

(73) Assignee: IMEC, Leuven (BE)

( * ) Notice: Subject to any disclaimer, the term of this patent is extended or adjusted under 35 U.S.C. 154(b) by 421 days.

(21) Appl. No.: 11/398,089

(22) Filed: Apr. 4, 2006

(65) Prior Publication Data

US 2006/0198185 A1 Sep. 7, 2006

Related U.S. Application Data

(62) Division of application No. 10/703,151, filed on Nov. 6, 2003, now Pat. No. 7,068,537.

(60) Provisional application No. 60/424,659, filed on Nov. 6, 2002.

(30) Foreign Application Priority Data

Nov. 7, 2002 (EP) .................................. 02447211

(51) Int. Cl.
*H01L 21/00* (2006.01)
(52) U.S. Cl. .............................. 438/3; 438/5; 257/421; 257/422; 365/171; 365/173
(58) Field of Classification Search ................. 438/2–6; 365/171, 173; 257/421–427, E21.665
See application file for complete search history.

(56) References Cited

U.S. PATENT DOCUMENTS 4,935,263 A 6/1990 Satoh et al.
(Continued)

FOREIGN PATENT DOCUMENTS

EP 0 573 372 A2 12/1993
(Continued)

OTHER PUBLICATIONS

Qian et al., "Magnetic design and fabrication of linear spin-valve sensors", IEEE Transactions on Magnetics, vol. 39, No. 5, pp. 3322-3324 (Sep. 2003).
(Continued)

*Primary Examiner*—Thinh T Nguyen
(74) *Attorney, Agent, or Firm*—Knobbe Martens Olson & Bear LLP

(57) ABSTRACT

A method and magnetic device for improving the desirable properties of a magnetic device, e.g., magnetization uniformity and reproducibility. Moreover the invention provides magnetic cells that are more magnetically homogeneous, with smaller amount of end domain magnetization canting from the average cell magnetization direction. The invention may provide a magnetic memory cell with less variation in switching fields, more spatially coherent dynamical magnetic properties for high speed and processional or coherent magnetic switching, and higher signal due to the increased uniformity. It may provide a magnetic sensor with more spatially coherent magnetic properties for high speed and processional or coherent magnetic switching, and increased signal. It may provide a read head element with more spatially coherent magnetic properties for high speed and processional or coherent magnetic sensing, and increased signal.

15 Claims, 42 Drawing Sheets

U.S. PATENT DOCUMENTS

| | | | |
|---|---|---|---|
| 5,041,922 A | | 8/1991 | Wood et al. |
| 5,331,728 A | | 7/1994 | Argyle et al. |
| 5,574,961 A | * | 11/1996 | Edelstein et al. ............ 428/548 |
| 5,729,413 A | | 3/1998 | Gooch et al. |
| 5,748,524 A | | 5/1998 | Chen et al. |
| 5,835,314 A | * | 11/1998 | Moodera et al. ......... 360/324.2 |
| 5,901,018 A | | 5/1999 | Fontana, Jr. et al. |
| 6,028,786 A | * | 2/2000 | Nishimura .................. 365/173 |
| 6,110,751 A | * | 8/2000 | Sato et al. ...................... 438/3 |
| 6,131,271 A | * | 10/2000 | Fontana et al. ........... 29/603.14 |
| 6,710,984 B1 | | 3/2004 | Yuasa et al. |
| 2001/0030886 A1 | | 10/2001 | Thewes et al. |
| 2002/0055190 A1 | | 5/2002 | Anthony |

FOREIGN PATENT DOCUMENTS

| | | |
|---|---|---|
| EP | 0 875 901 A2 | 11/1998 |
| JP | 06036275 | 2/1994 |
| WO | WO 00/72324 A1 | 11/2000 |
| WO | WO 02/35559 A2 | 5/2002 |

OTHER PUBLICATIONS

Slaughter, et al., "Fundamentals of MRAM technology", Journal of Superconductivity: Incorporating Novel Magnetism, vol. 15, No. 1, pp. 19-25 (Feb. 2002).

European Search Report dated Apr. 17, 2003, for European Application No. 02447211.0.

Daughton, J.M., et al., "Applications of Spin Dependent Transport Materials" Journal of Physics D. Applied Physics, IOP Publishing, Bristol, GB, vol. 32, No. 22, Nov. 21, 1999, pp. R169-R177, XP000947410 ISSN: 0022-3727.

* cited by examiner

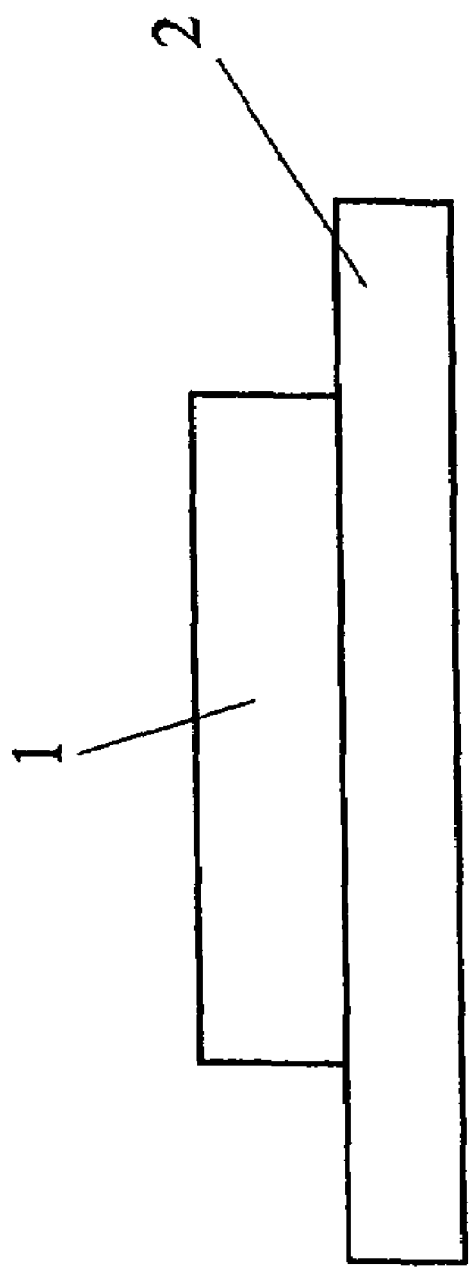

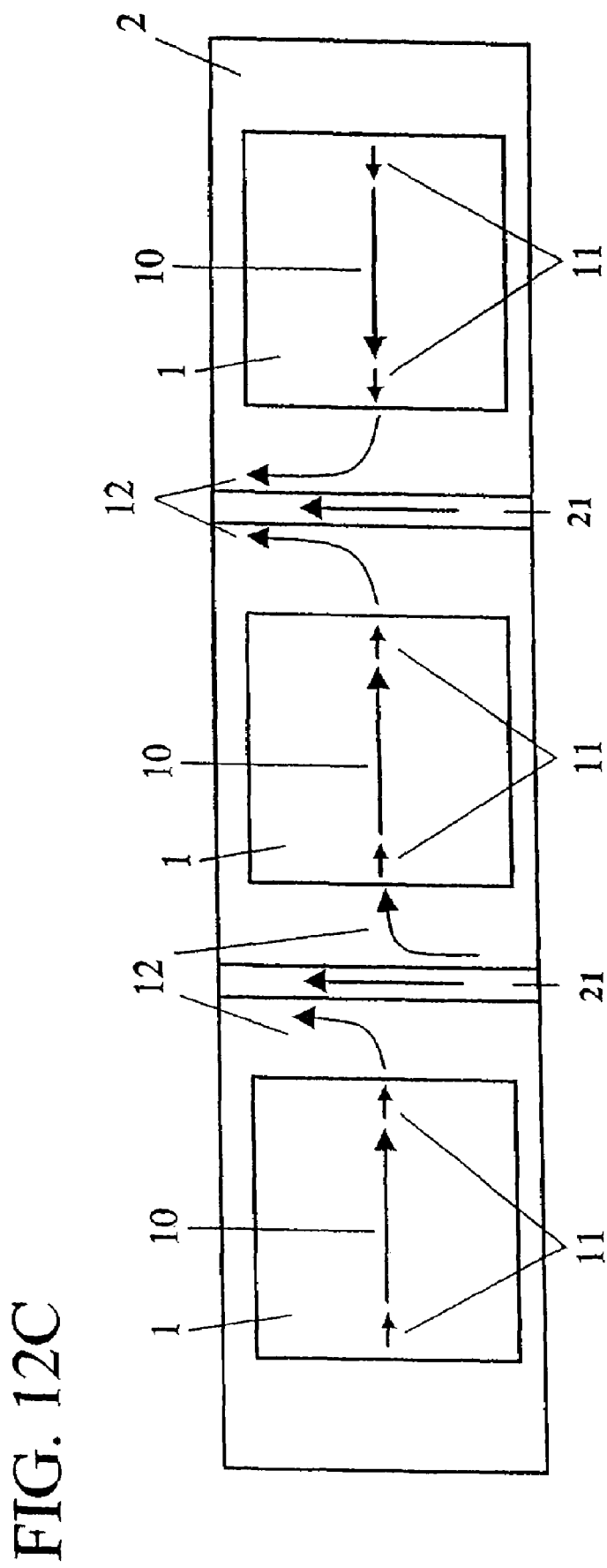

MAGNETIC DEVICE AND METHOD OF MAKING THE SAME

RELATED APPLICATIONS

This application is a divisional of U.S. patent application Ser. No. 10/703,151, filed on Nov. 6, 2003, now U.S. Pat. No. 7,068,537, which claims the benefit of U.S. provisional application No. 60/424,659 entitled "MAGNETIC DEVICE", filed on Nov. 6, 2002. Each of the above-referenced patent applications is hereby incorporated by reference herein in its entirety.

BACKGROUND OF THE INVENTION

1. Field of the Invention

This invention is related to the filed of magnetic memories, magnetic sensors, and magnetic recording heads. More particularly, this invention is related to a domain wall free operative soft magnetic cell device.

2. Description of the Related Art

Giant Magneto Resistance (GMR) and its descendants have been commercialized in the read head sensor of a magnetic recording head and in various other magnetic sensors. Companies are currently in the development stage to commercialize magnetic random access memory (MRAM) based on Tunneling Magneto Resistance (TMR) effects. Current issues in industry in magnetism include (1) higher speed (magnetization dynamics), (2) lower size, (3) patterned media, (4) concern over the super paramagnetic limit and others. Most industrial needs require micro structurally patterned thin-film magnetic elements.

Any magnetic sample with boundaries is difficult to magnetize completely right up to the boundaries. In particular, for technologically interesting thin film micro structured elements, closure domains form in the remnant state that partially demagnetize the element. As is known in the art, the term "domain" generally refers to a part or portion of a magnetic material in which magnetization is generally uniform and which behaves as a single magnetic entity. Such remnant states are undesirable for several reasons: they decrease remnant magnetization (for instance, lowering the maximum signal in a memory cell), they complicate magnetic structure and tend to complicate magnetic behavior, making study more difficult, and, in particular, they adversely effect the understanding and practice of high-speed magnetization processes due to their non-uniformity. Increased uniformity of magnetization, combined with reproducibility, is often desired in both research and device operation.

The shape of an ellipsoid, by its mathematical nature, may mimic magneto static continuity, suppress closure domains, and lead to uniform magnetization. For extremely small samples, the exchange interaction dominates magnetostatics, and is theorized to be able to lead to uniform magnetization (and, thus, suppression of closure domains). These are well known ideas in magnetism, available since the 1950s. Recent review books covering these ideas are (1) A. Aharoni, *Introduction to the theory of ferromagnetizm*, $2^{nd}$ Edition, Oxford University Press, Oxford (2000). (2) A. Hubert and R. Schafer, *Magnetic domains (The analysis of magnetic microstructures)*, Springer-Verlag, Berlin Heidelberg (1998), each of which is incorporated herein by reference in its entirety.

But real thin film ellipses are not 'exactly' ellipsoids and have been known to have closure domains, such that a uniform magnetization leading to substantially 1 single magnetic domain haven't been achieved.

Memory cells, spin valve GMR elements, and magnetic sensors currently (a) Ignore end domains; but end domains reduce GMR signal and increase variability from cell to cell (e.g. switching fields have too much variation amongst cells that are supposed to be identical).

(b) Use a hard bias for GMR read head element to sweep domains out of the element; but a hard bias lowers sensitivity.

(c) Play with cell shape to reduce end domains and/or their effects; but playing with sample shape is difficult and time-consuming for fabrication. Moreover end domains are rarely eliminated.

Various methods to handle end domains exist:

(a) Pin cell ends so that switching is less variable (U.S. Pat. No. 5,748,524, 'MRAM with pinned ends', Chen et al., which is incorporated herein by reference in its entirety); here some TMR or GMR signal is lost due to the pinned ends not contributing.

(b) Edge closer structure in laminates in recording head yoke (U.S. Pat. No. 5,331,728, 'Method of fabricating magnetic thin film structures with edge closure layers', Argyle et al., which is incorporated herein by reference in its entirety); which is difficult and time-consuming to produce.

(c) Induce a single domain magnetic state by providing a vertical flux closure path (patent no. EP 0 875 901 A2, which is incorporated herein by reference in its entirety) This is done by adding a magnetic region at the side edges of a first and a second magnetic layer that make up a magneto-resistive memory cell. A closed magnetic circuit is formed vertically to the plane of the cell and involves both the first and second magnetic layer to provide the flux closure path.

(d) Induce a single domain magnetic state in a 3D ellipsoidal magnetic cell. In WO 02/35559 A2, which is incorporated herein by reference in its entirety, a vortex-free single domain state is induced by adding layers with an area less than the area of the original layer. The smaller layers act to provide a reduced and more uniform demagnetizing field for the total bit, thereby inhibiting vortex formation and improving the operating characteristics of the magneto-electronic element. The most preferred configuration is a 3D ellipsoidal element that theoretically has uniform demagnetizing field for the total bit element.

(e) In US patent application US2002/0055190, which is incorporated herein by reference in its entirety, ('Magnetic memory with structures that prevent disruptions to magnetization in sense layer', Thomas C. Anthony), a keeper structure providing a flux closure path to direct demagnetization fields away from the sense layer is disclosed. However, the magnetization in the keeper and the cell are always perpendicular to each other and no single magnetic domain state is induced in the cell.

In [Z. Qian et al., IEEE Transactions on Magnetics, vol. 39, NO. 5, SEPTEMBER 2003, p 3322, which is incorporated herein by reference in its entirety], a similar method adds a third magnetic layer to a magneto-resistive cell with a first and a second (sense) layer. The third layer has a predetermined magnetization anti-parallel to the first magnetic layer to provide a vertical flux closure path for the first magnetic layer, This method reduces the fringing fields from the first layer, thereby improving the operating characteristics of the second layer.

Similarly in document JP06036275, which is incorporated herein by reference in its entirety, a thin film is added under a vertical magnetic recording medium, as well as a keeper structure at the outer and inner peripheral end. The soft layer and the keepers concentrate the magnetic flux in the recording head.

In US patent 2001030886, which is incorporated herein by reference in its entirety, insulating regions with large relative permeability are added around the memory cell, the bit lines and the word lines. This is to improve the coupling of the magnetic fields generated by the bit lines and/or word lines to the magneto-resistive memory cell as to reduce the currents necessary to change the magnetization state of the memory cell.

However those last three inventions do not imply single domain behavior of the magnetic cell.

SUMMARY OF THE CERTAIN INVENTIVE ASPECTS

It is an aim of the invention to offer an element of control to the degree of magnetization uniformity and amount of flux-closure suppression in a magnetic cell.

The present invention is related to a magnetic device comprising:
- A magnetic cell (1) in the form of a thin-film structure of a first magnetic material of a first permeability; and
- An immersion layer (2) of a second magnetic material of a second permeability, the immersion layer being substantially parallel to the plane of the cell and the immersion layer in magnetic contact with the magnetic cell, the immersion layer being arranged so as to provide a magnetic flux closure path in the plane of the immersion layer, in order to obtain an substantially uniform magnetization in the magnetic cell, when the cell is magnetized.

In certain embodiments the immersion layer does not have a predetermined uniform magnetization direction, when the cell is magnetized.

The first magnetic material may have a higher permeability, a lower permeability or equal permeability than the second magnetic material.

The magnetic cell may be in direct contact with the immersion layer.

The immersion layer may be discontinuous and/or comprising different separated subparts.

The magnetic cell may be attached on top of the immersion layer.

The edges of the magnetic cell may be in direct contact with the immersion layer. In that case, the upper surface of the magnetic cell may extend above the level of the upper surface of the immersion layer, or the upper surface of the magnetic cell may extend below the upper surface of the immersion layer or the upper surface of the cell may be at the same level with the upper surface of the immersion layer.

The magnetic cell may be at least partially embedded in the immersion layer.

The magnetic device of the invention may comprise between the magnetic cell and the immersion layer a spacer layer comprising a non magnetic material.

The spacer layer may comprise a conductor material or of an insulator material.

The magnetization of the magnetic cell may form a single magnetic domain.

According to the invention, the magnetic cell may have a rectangular shape or an elliptical shape.

The thickness of the magnetic cell may be larger, smaller than, or equal to the thickness of the immersion layer.

The magnetic cell may be smaller than the immersion layer. At least one of the in-plane dimensions of the immersion layer may be substantially smaller or of the same size than those of the magnetic cell. Both in-plane dimensions of the immersion layer may be substantially smaller or of the same size than those of the magnetic cell.

The invention further provides a method of producing a magnetic device. The method comprises the steps of
- Providing a base layer,
- Depositing a first layer comprising a magnetic material on the base layer,
- Defining a cell area of the first layer corresponding to the required magnetic cell structure,
- Performing a subtractive etch patterning step on the first layer, except for the cell area, for only a part of the thickness of the first layer.

In another embodiment, the invention provides a method for producing a magnetic device, comprising a magnetic cell structure. The method comprises the steps of
- Providing a base layer,
- depositing a first layer comprising a first magnetic material on the base layer,
- providing a second layer comprising a second magnetic material,
- Defining a cell area of the second layer corresponding to the required magnetic cell structure,
- Performing a subtractive etch patterning step on the second layer, except for the cell area, for the entire thickness of the second layer.

Between the deposition step of the first layer and the deposition step of the second layer an extra step may be performed of depositing a sacrificial layer comprising a non magnetic material, and wherein the subtractive etch patterning step is performed such that at least part of the sacrificial layer is removed.

In another embodiment, the invention provides a method of producing a magnetic device comprising a magnetic cell structure. The method comprises the steps of:
- Providing a base layer
- Etching one or more trenches in the base layer, each trench corresponding to the magnetic cell structure, the base layer having thus a non-flat topology.
- Depositing a first layer comprising magnetic material on the base layer with the non-flat topology.

The latter method may comprise an additional step of planarization of the first layer. It may further comprise an additional step of depositing a second layer comprising a second magnetic material on top of the planarized surface.

The planarization of the first layer may equally be continued until the base layer is reached, and the method of the invention may further comprise the step of depositing a second layer comprising a second magnetic material on top of the planarized surface.

The trenches may have an elliptical shape or a rectangular shape in the in-plane dimension.

The base layer may be a substrate or a processed substrate.

The invention is equally related to a magnetic memory device comprising:
- a bit line comprising a conductor material,
- a magnetic device, according to the invention, attached on top of the bit line.

In a magnetic memory device of the invention, the immersion layer of the magnetic device may have the same or a smaller width than the bit line.

The immersion layer may have the same or a smaller length than the bit line.

The easy axis of the magnetic device may be perpendicular or orthogonal to the long dimension of the bit line. The easy axis of the magnetic device may be at an angle to the long dimension of the bit line.

The invention is equally related to a magnetic memory array device comprising:

A bit line comprising a conductor material.

At least 2 magnetic devices according to the invention, wherein the magnetic devices are attached next to each other on the bit line and wherein the magnetic devices are not touching.

In a magnetic memory array device of the invention, all of the magnetic devices may share the same immersion layer.

In a magnetic memory array device of the invention, the magnetization direction of all of the magnetic devices may be parallel with the long dimension of the bit line.

A magnetic memory array device according the invention may further comprise between each pair of the magnetic devices an additional magnetic structure, wherein the additional magnetic structure comprises a magnetic material and wherein the additional magnetic structure has a shape such that the magnetization in it is substantially perpendicular to the long direction of the bit line and substantially parallel to the width direction of the bit line.

The invention is equally related to a magnetic field sensor device comprising:

A sensor area defined by a sensor layer,

A soft magnetic flux guide, comprising a magnetic material with a low permeability, for guiding flux lines to the sensor area, wherein the soft magnetic flux guide is adjacent to the sensor area.

A magnetic immersion layer comprising a material of a low permeability.

In a magnetic field sensor device according to the invention, the magnetic immersion layer may contact both the sensor layer and the soft magnetic flux guide.

Alternatively, the magnetic immersion layer may contact the sensor layer or the magnetic immersion layer may contact the soft magnetic flux guide.

The sensor area may comprise 2 GMR sensor layers in line and the soft magnetic flux guide may extend in 2 areas, the 2 areas being located on either side of the 2 GMR sensor layers in line.

The magnetic cells may be immersed in a same immersion layer and the magnetic cells may be positioned on a regular lattice configuration.

BRIEF DESCRIPTION OF THE DRAWINGS

FIGS. 2A, 2B and 2C illustrate that the magnetic structure may be just touching the immersion layer or may be partially or fully embedded in the immersion layer.

FIGS. 8A-8D moreover illustrate the possibility of varying the thickness of magnetic structure and immersion layer with respect to each other.

FIGS. 12A, 12B, 12C, and 12D show array embodiments of the present invention, which may be typically used for MRAM devices.

DETAILED DESCRIPTION OF THE CERTAIN EMBODIMENTS OF THE INVENTION

Figure 1A:
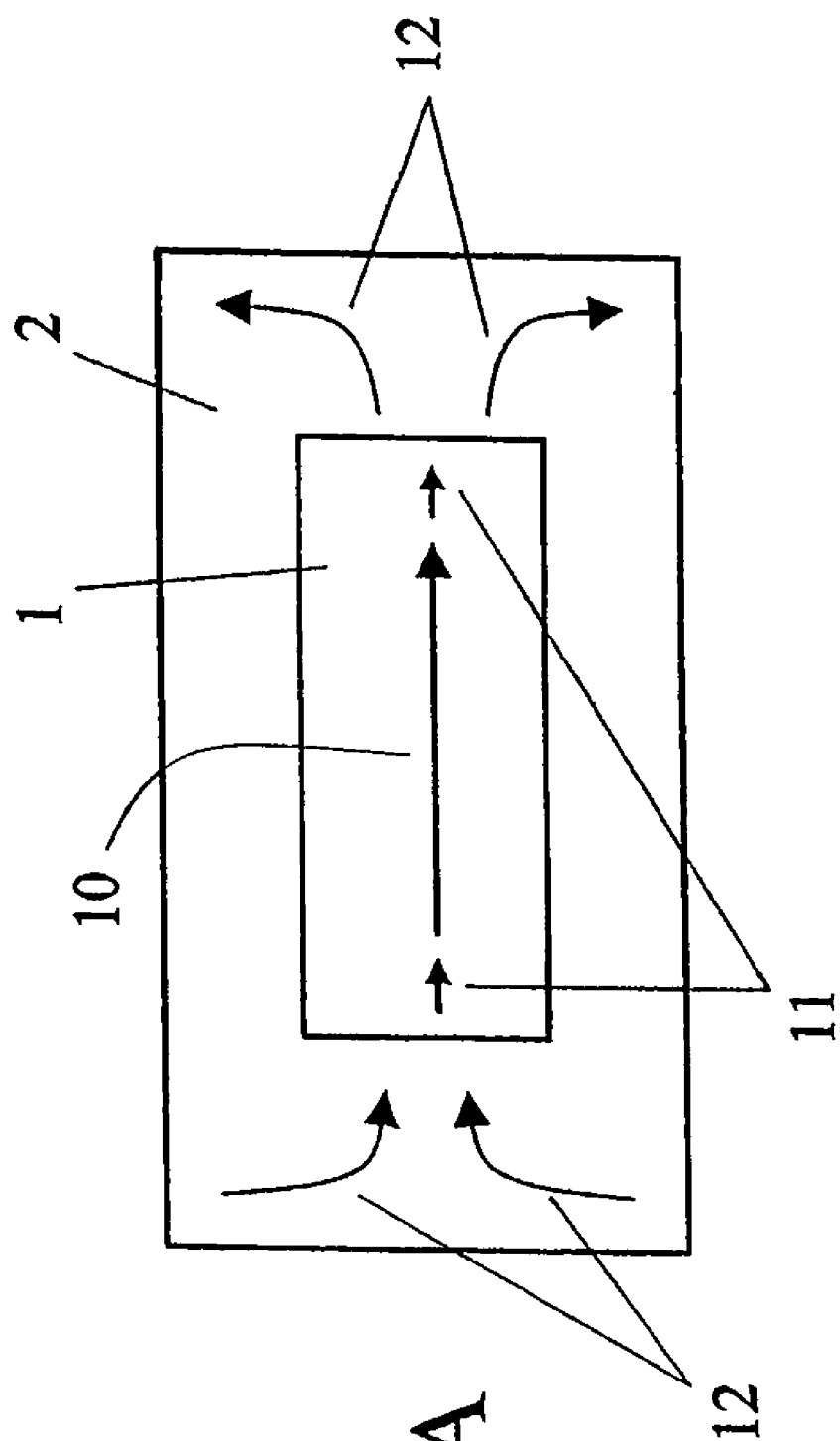
FIG. 1A shows a plan view of an embodiment of the invention comprising a rectangular shaped thin film magnetic structure embedded in an immersion magnetic layer.

FIG. 1 shows a device according to the invention. In certain embodiments, the device comprises a magnetic cell 1, in the form of a thin-film structure of magnetic material. The magnetic cell is a flat strip with a substantially constant thickness. According to the invention, this cell is in magnetic contact with an immersion layer 2, equally of magnetic material, not necessarily the same as the material of the cell 1. The immersion layer is parallel to the plane of the cell. The term 'magnetic contact' in the context of the invention refers to a contact allowing magneto static continuity, i.e. allowing flux lines to pass from the magnetic cell into the immersion layer. The contact may be direct, or via a non-magnetic spacer layer (see further). The immersion layer may comprise one large magnetic area possibly in connection with several magnetic cells. The layer 2 may equally comprise a number of smaller area's, all in contact with a particular cell, as will be explained further.

The purpose of immersion layer is to provide a flux closure path for flux lines appearing in the cell when the cell is magnetized. The flux closure path in the immersion layer is essentially two-dimensional, i.e. it is located in the plane of the immersion layer.

The effect of the flux closure path being provided is that an substantially uniform magnetization is obtained in the cell 1. According to one embodiment, the magnetization direction in the immersion layer is not predefined. In other words, the pattern of flux lines in the layer is not predefined and may depend on the specific conditions.

For the purpose of this invention, 'magnetic material' may refer to any magnetic material known in the art, as for instance, but not only, Permalloy (Ni 80%-Fe 20%) or Supermalloy (Ni 80%-Fe 15%-Mo 5%-Mn<1%), or CoFe and CoNiFe alloys of various types.

A method for improving the desirable properties of a magnetic device, as e.g. magnetization uniformity is disclosed. Moreover the invention provides magnetic cells that are more magnetically homogeneous, with smaller amount of end domain magnetization canting from the average cell magnetization direction. The invention may provide a magnetic memory cell with less variation in switching fields, more spatially coherent dynamical magnetic properties for high speed and precessional or coherent magnetic switching, and higher signal due to this increased uniformity. It may provide a magnetic sensor with more spatially coherent magnetic properties for high speed and precessional or coherent magnetic switching, and increased signal. It may provide a read head element with more spatially coherent magnetic properties for high speed and precessional or coherent magnetic sensing, and increased signal.

In one embodiment the invention provides a combination of a magnetic structure in magnetic contact, for the purposes of magneto static continuity, with an immersion magnetic layer. For example, a thin-film magnetic microstructure is embedded in a continuous thin magnetic film. At the edge of the microstructure, the magnetic flux lines (and magnetization) may remain perpendicular to the edge by being able to flow out into the immersion magnetic layer. Reduction of the closure domains and increase of the magnetization homogeneity in the magnetic structure is one benefit of the invention. By choice of materials and spatial size and shape of both structure and layer, and by choice of the physical relationship between the magnetic structure and the immersion magnetic layer, the ability to manipulate and control the level of flux flow between the two, the amount of magnetization inhomogeneity in the magnetic structure, and the amount of flux closure in a given magnetic field is provided.

The invention applies to any size and shape of magnetic sample structure. The solution may be applied to very small structures and/or (close-to) perfect ellipsoids to improve their uniformity further.

Increasing the uniformity to the structure edges of a magnetic cell may increase the signal considerably. For example, in small MRAM cells, the end domains may take up a substantial portion (e.g., 30%) of the area of the cell meaning the invention may increase signal (assuming the pinned ends) by as much as 30 to 70% or an average of 50% increase.

In addition to improving the signal and effect on speed due to a single magnetic domain, the invention advantageously allows reproducibility. With the invention's single domain behavior, better reproducibility is achieved in a very skillful way.

Figure 1B:
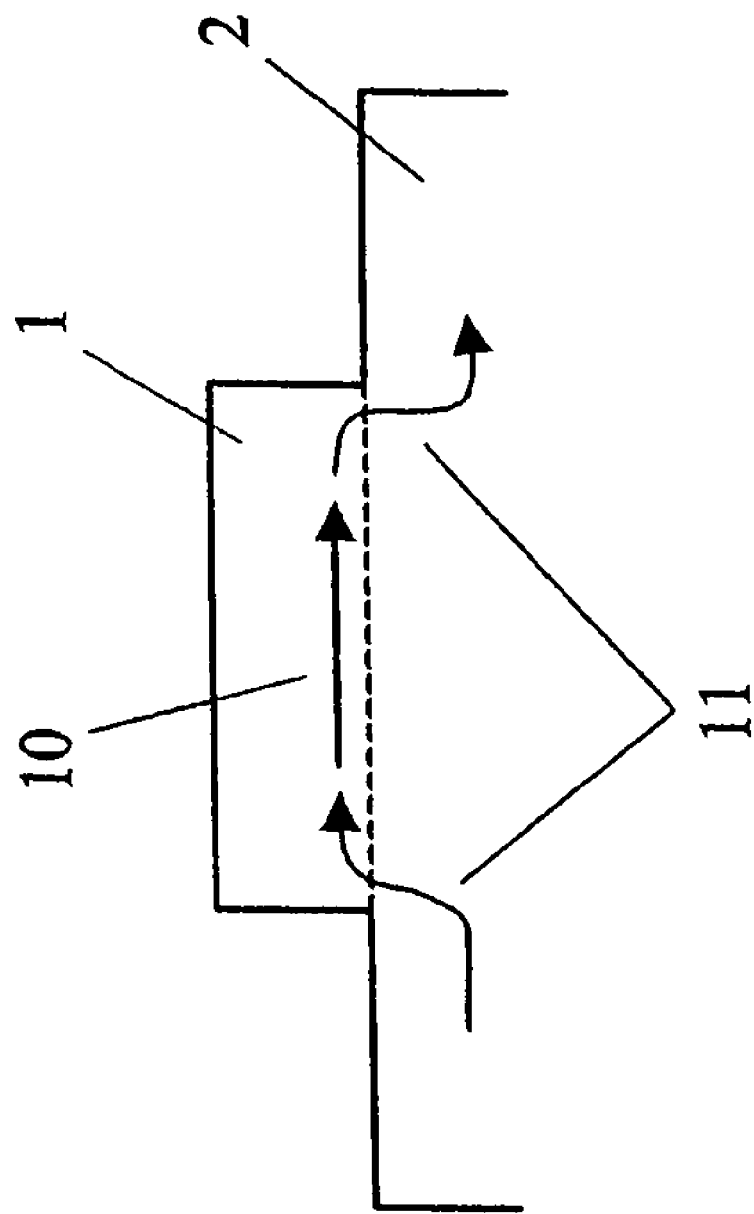
FIG. 1B shows a cross-sectional view of the embodiment of FIG. 1A.

FIG. 1a shows a plan view of an embodiment of the invention comprising a shaped thin film magnetic structure 1 (also called magnetic cell), embedded in an immersion magnetic layer 2. Where 1 is in contact with 2, magnetic flux lines flow easily between them. Therefore the free pole energy associated with magnetization perpendicular to the left and right edges of 1 is greatly reduced. This allows the magnetization in 1, represented by the arrow 10, to remain uniformly aligned from end to end, including in the magnetization 11 representing the end of the structure where free poles would tend to collect. That is, end domains of 1 are reduced and/or removed due to the magnetic contact with 2. FIG. 1b shows a cross-sectional view of this same embodiment. The flux lines 11 flow in and out of 1 from 2 reducing the free pole energy and fringing fields of 1 at the perpendicular-to-magnetization-direction ends.

It is important to note that according to the invention, the immersion layer 2 does not have a predetermined magnetization.

In other words, the end domains are removed from 1 at the expense of occurring in 2 (that is, creating an inhomogeneous magnetization distribution in 2, represented by the arrows 12). This distribution may be the so-called flower state (as shown; a generic description given to a magnetic pattern where the magnetization is fairly uniform but points towards the corners as you get close to them), or any other non-uniform distribution of magnetization. The distribution will be determined from a combination of the characteristics of end and/or closure domains that would otherwise occur in 2 given its shape and the end and/or closure domains that would otherwise occur in 1 (due to the effect of flux flowing, and magneto static energy passing, between 1 and 2). Under the correct circumstances (for example, for a soft or highly permeable magnetic material 2), the magnetization distribution in 2 will tend to arrange itself in order to increase spatial homogeneity of the demagnetizing field in 1. In this sense, the magneto static energy contained in the magnetization distribution in 2 plays the same role as exchange energy in very small magnetic structures, leading to increased possibility of creating a single magnetic domain condition for 1. The arrows 12 which are shown in the accompanying drawings always refer to an example of such a magnetization distribution in 2, never to a predetermined magnetization direction.

Figure 1C:
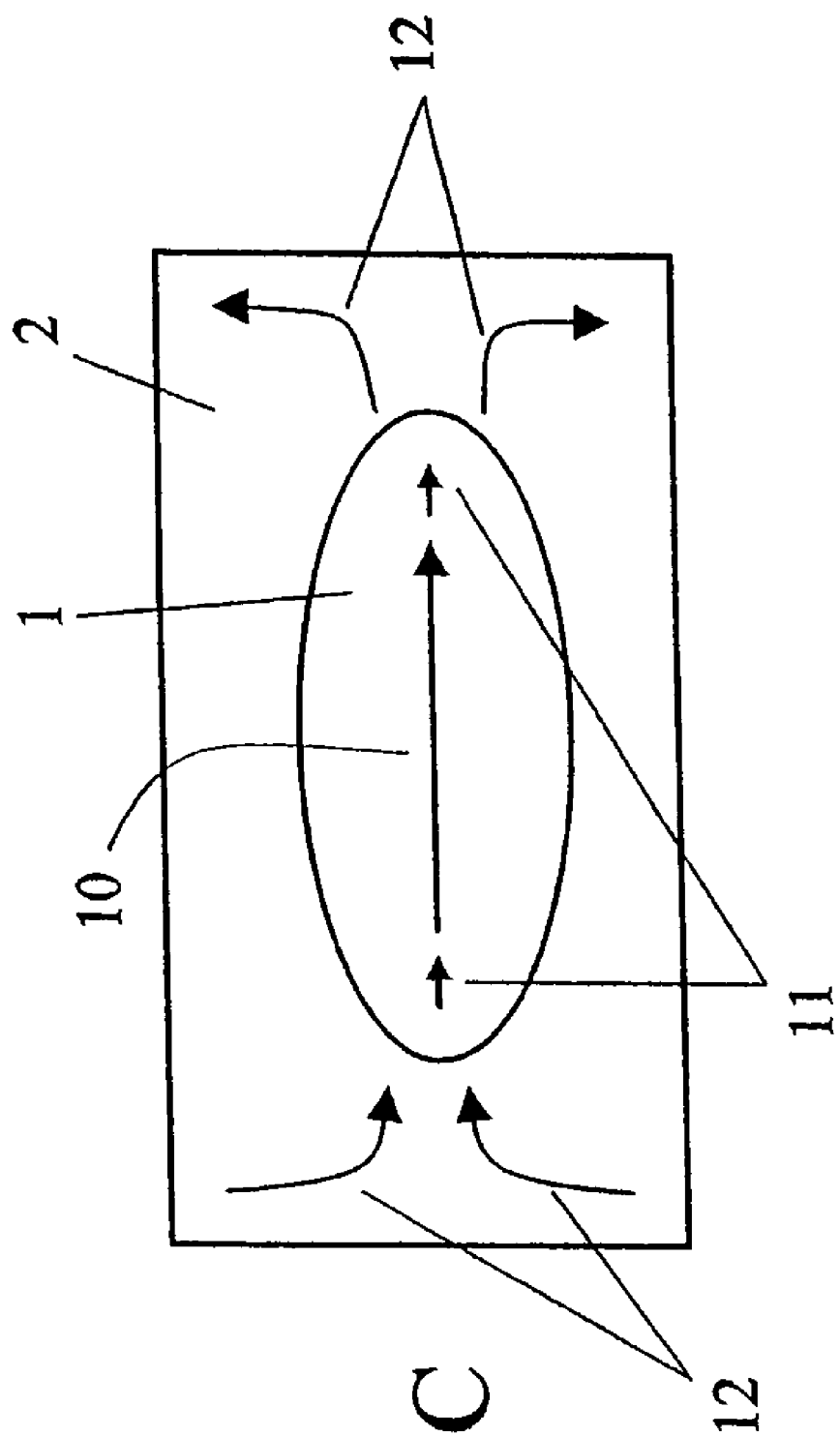
FIG. 1C shows a plan view of another embodiment of the invention comprising an elliptical shaped thin film magnetic structure embedded in an immersion magnetic layer.
Figure 1D:
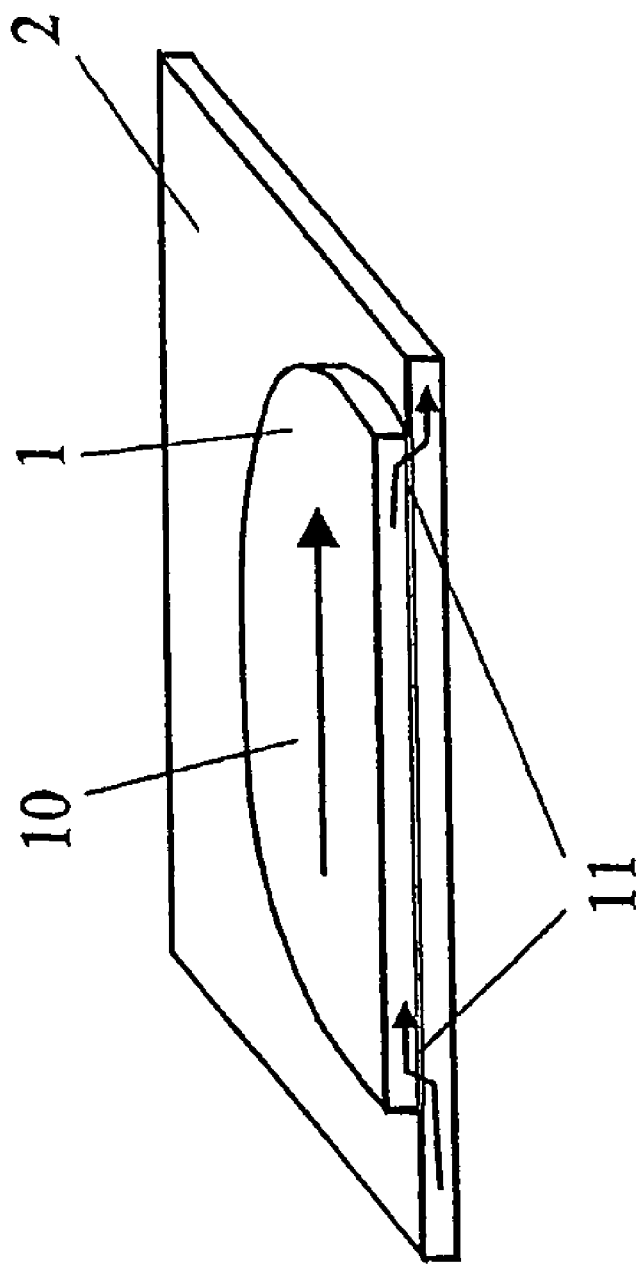
FIG. 1D shows a cut away 3D view of the embodiment depicted in FIG. 1C.

In another embodiment the shape of 1 is elliptical rather than rectangular (FIG. 1c). FIG. 1d shows a cut away 3D view of the embodiment shown in FIG. 1c.

The benefit of a single domain particle behavior may be very large for magnetization reversal devices. Stoner-Wohlfarth rotation is a result of single-domain behavior and is desirable in switching in MRAM to lower the half-select threshold (J. M. Slaughter, R. W. Dave, M. DeHerrera, M. Durlam, B. N. Engel, J. Janesky, N. D. Rizzo, and S. Tehrani, "Fundamentals of MRAM Technology", Journal of Superconductivity: Incorporating Novel Magnetism, Vol. 15, No. 1, 19-25 (February 2002), which is incorporated herein by reference in its entirety.). In processional switching, single domain behavior is also beneficial to switching properties.

Figure 3A:
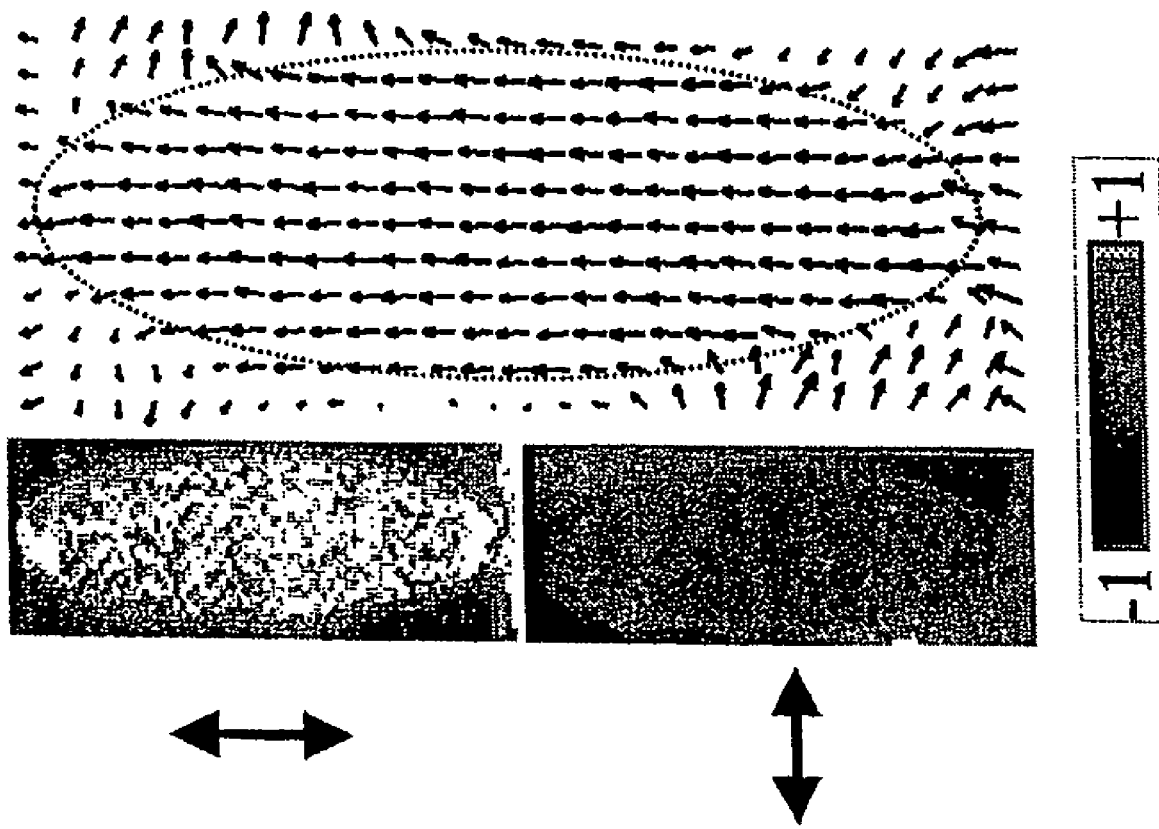
FIGS. 3A-3B show experimental data for the embodiment depicted in FIG. 1C and FIG. 1D.
Figure 3B:
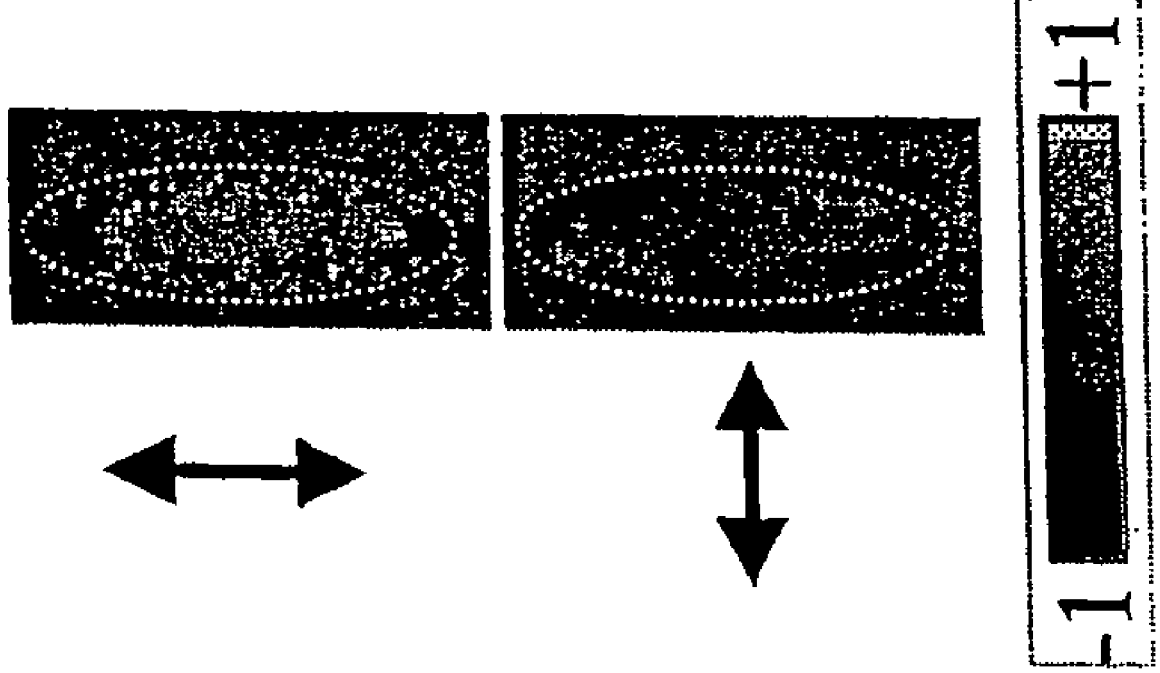

FIGS. 3a-3c are experimental data support figures for the embodiment depicted in FIG. 1c and FIG. 1d. for the desired behavior brought about by the invention. FIG. 3a shows the magnetization vector components at the top surface of 1 and 2, of one experimentally realized embodiment, measured with the magneto-optical Kerr effect. In this case, 1 is a 20 micron by 7 micron ellipse shaped magnetic structure and 2 is a much larger film made out of the same material. The thickness of 1 is 16 nm and the thickness of 2 is about 5 nm. In this case, the device is made by defining a lithographic pattern in photo resist for the shape of 1, applying dry etching to remove the magnetic film, but only removing part of the magnetic film (the top 11 nm) leaving an immersion layer of 5 nm thickness. The dotted line denotes the edge of 1 and three representations of this device are shown. The top left representation is a gray-scale map of the vertical component of magnetization, the bottom left a gray-scale map of the horizontal component of magnetization and the right is a vector representation. The magnetization state captured is the one at remanence after a magnetic field oriented orthogonal on the cell surface has been reduced from saturation to zero. The vector image shows the magnetization being highly uniformly magnetized within the boundaries of 1, right up to the edges (also confirmed by the homogeneous colors within the left images). The magnetization in 2 is non-uniform. The arrows indicate a continuous flow of magnetization vector direction between 1 and 2, which is indicative of a continuous flow of flux between 1 and 2. A device made according to the prior art (without at least material 2) is shown in FIG. 3b. This material is a 12 micron by 5 micron ellipse shaped structure, made of the same material as in 3a, of the same thickness as 1 in 3a of 16 nm, and measured after a similar remanence process where a magnetic field oriented orthogonal on the cell surface is reduced from saturation to zero. The magnetization is represented in the same gray-scale way as the first two representations of FIG. 3a. The gray color outside the dotted line indicates no magnetization in either direction, which is consistent with there being no magnetic material in this region. The colors inside of the dotted line vary as a function of position, indicating that end domains and nonuniformity of the magnetization occurs within the structure.

Figure 4A:
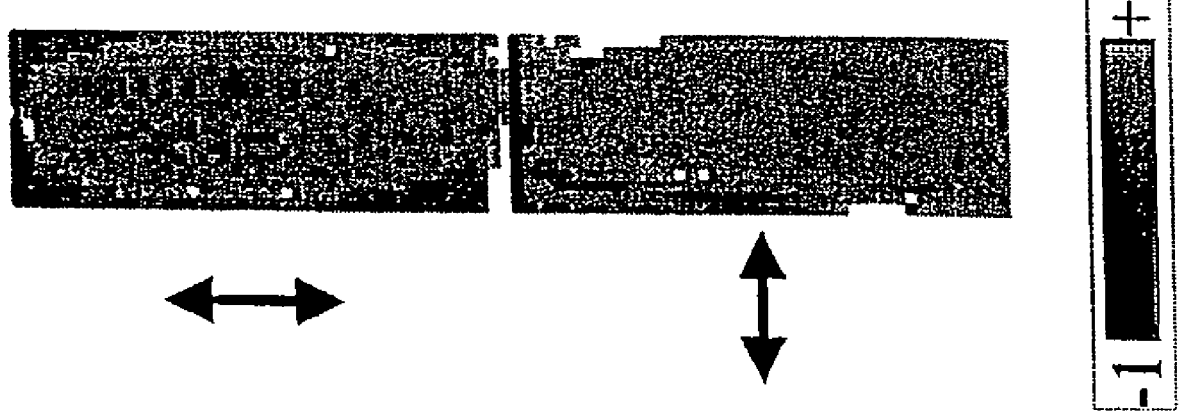
FIG. 4A shows experimental evidence relating to the maintenance of a single domain uniformity in a processional switching process in an experimentally realized embodiment of the invention.
Figure 4B:
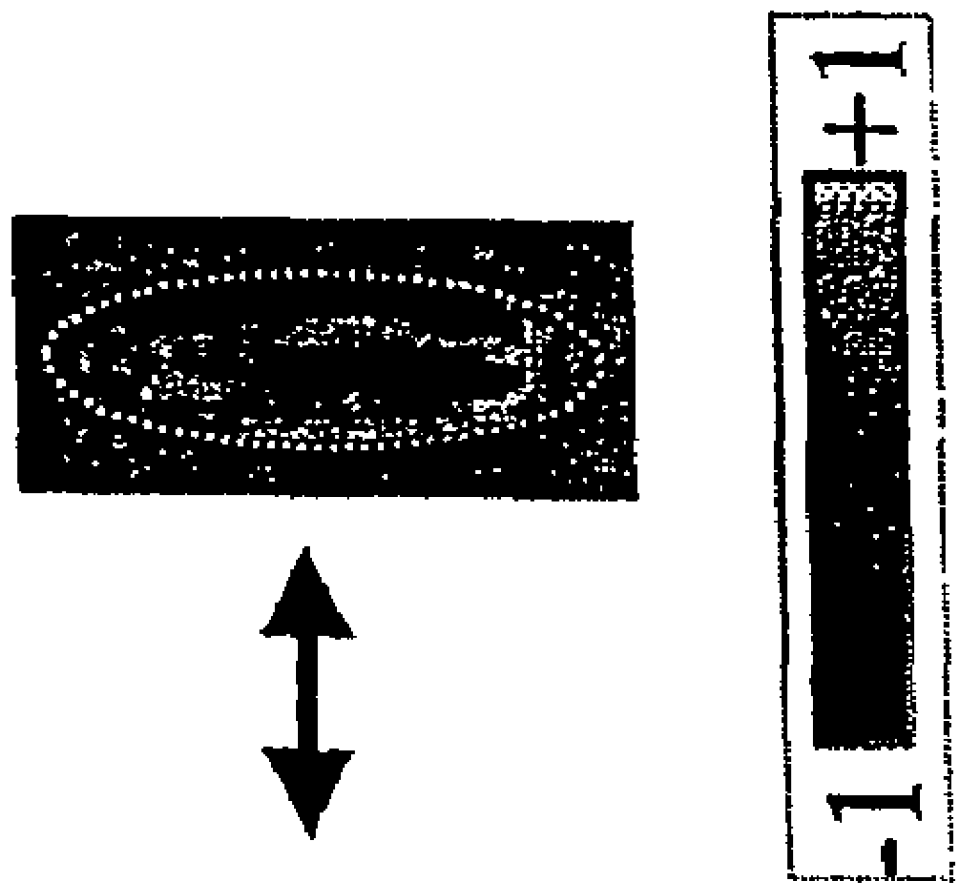
FIG. 4B shows a large nonuniformity in an experimental structure of a prior art style (with no immersion layer).

That single-domain behavior is an advantage for magnetic switching applications is well known. FIG. 4a shows some experimental evidence of the maintenance of single domain uniformity in a processional switching process in an experimentally realized embodiment of the invention, while FIG. 4b shows large nonuniformity in a similar experimental structure of prior art style (with at least no immersion layer). In FIG. 4a, the experimental embodiment of the invention from FIG. 3a is tested in high-speed operation and in FIG. 4b, the prior art (no immersion layer) device of FIG. 3b is tested in high-speed operation.

Both samples start in their initial remnant states, which are shown in FIGS. 3a-b. A step field in the horizontal, transverse direction is applied in each case with a rise time of a few hundred picoseconds. The amplitude of the field is about 31 Oe for FIG. 4a and about 41 Oe for FIG. 4b. The images show response about 2 ns after field turn-on. For the immersion sample, the response is very spatially uniform within the mesa area of the ellipse. For the sample with no immersion, the response is definitely non-uniform. Thus, the invention pertains not only to the static properties of structure 1 but to the dynamic properties as well. Increased uniformity contributes to a more likely chance of coherent rotation and Stoner-Wohlfarth behavior. Dynamic reorganization of the magnetization distribution in layer 2 may further act to keep the demagnetizing field more uniform in 1 at instances throughout the duration of dynamic and non-equilibrium processes in 1.

Figure 2B:
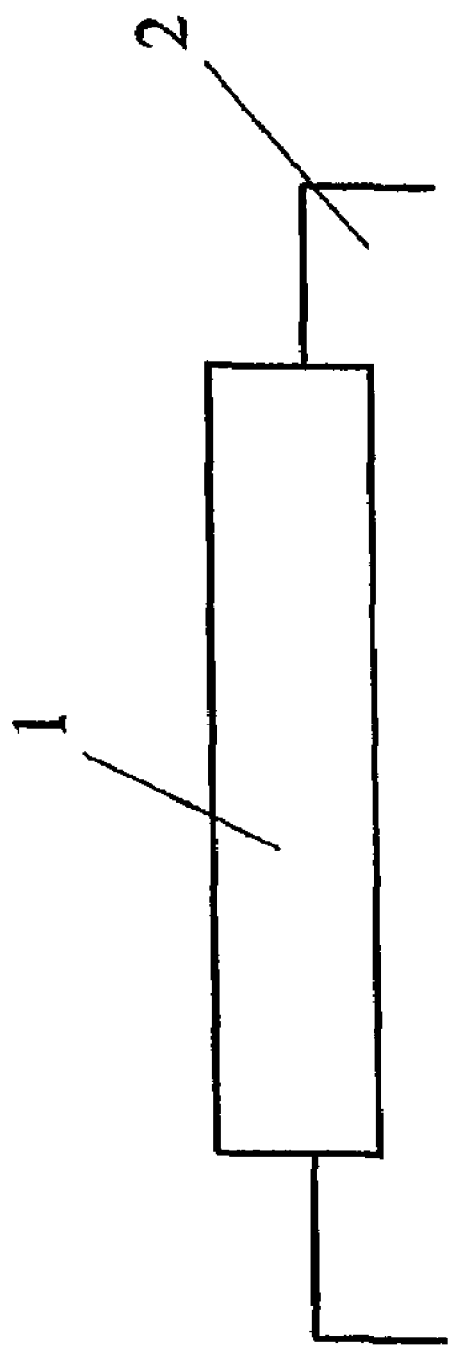
Figure 2C:
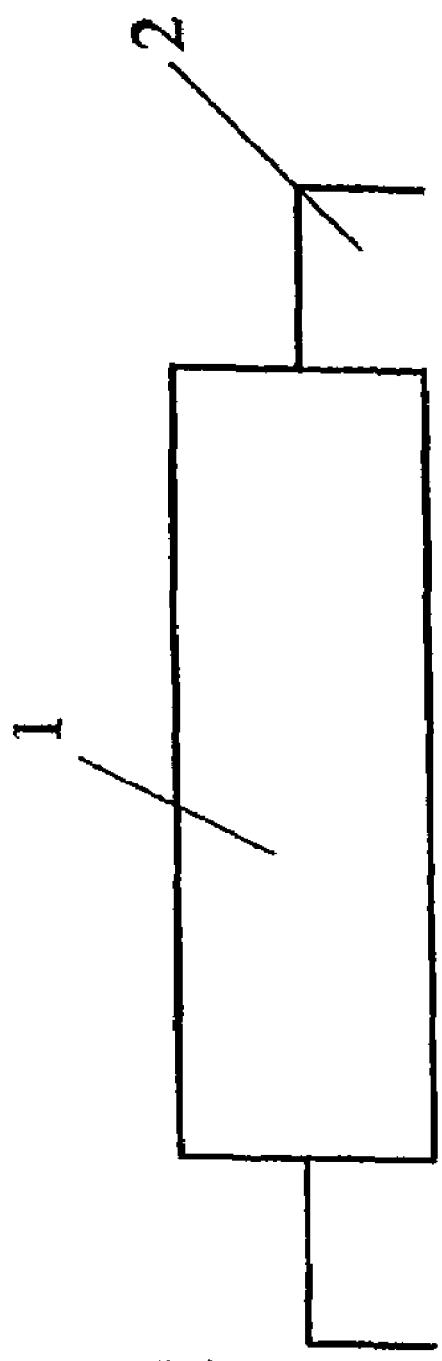

The shape of 1 may be any 2-dimensional shape. Likewise, the shape of 2 may be any 2-dimensional shape. 1 and 2 may be the same material or a different material. If 1 and 2 are different materials, 1 may be touching, may be partially embedded, or may be fully embedded in 2 as shown in FIGS. 2a-2c.

Figure 5A:
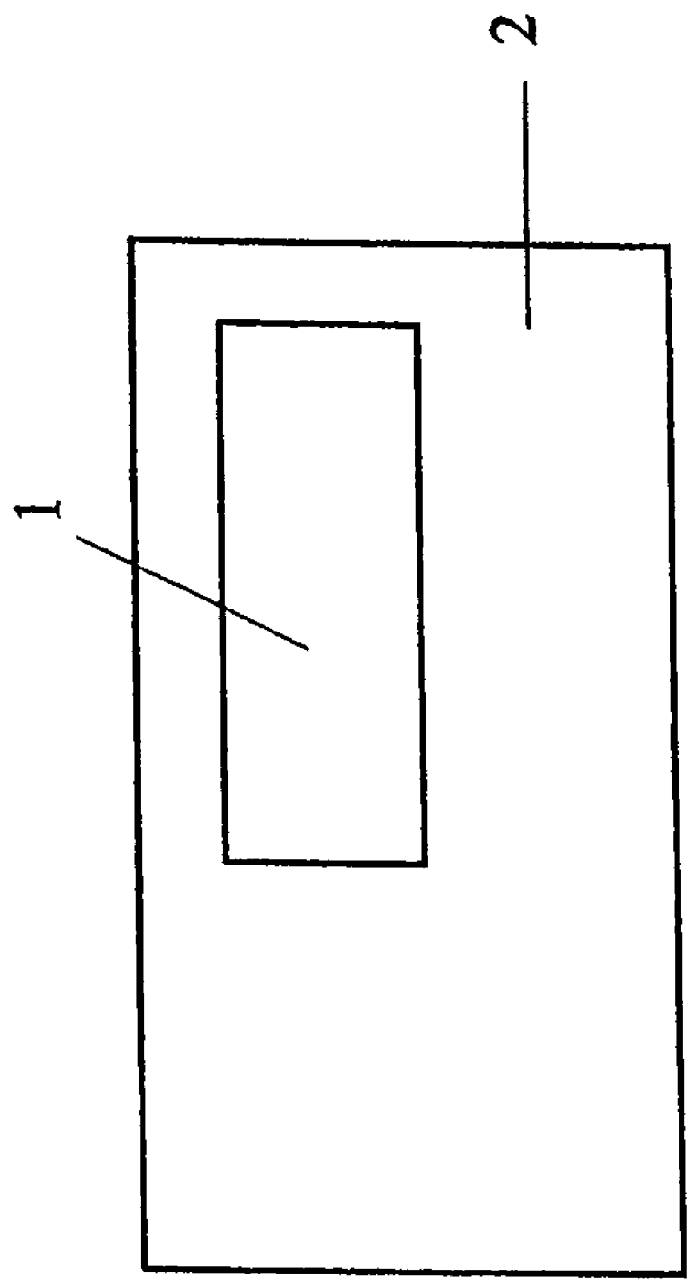
FIG. 5A shows an embodiment of the present invention wherein the magnetic structure is positioned acentric (i.e., away from the center) with respect to the immersion layer.
Figure 5B:
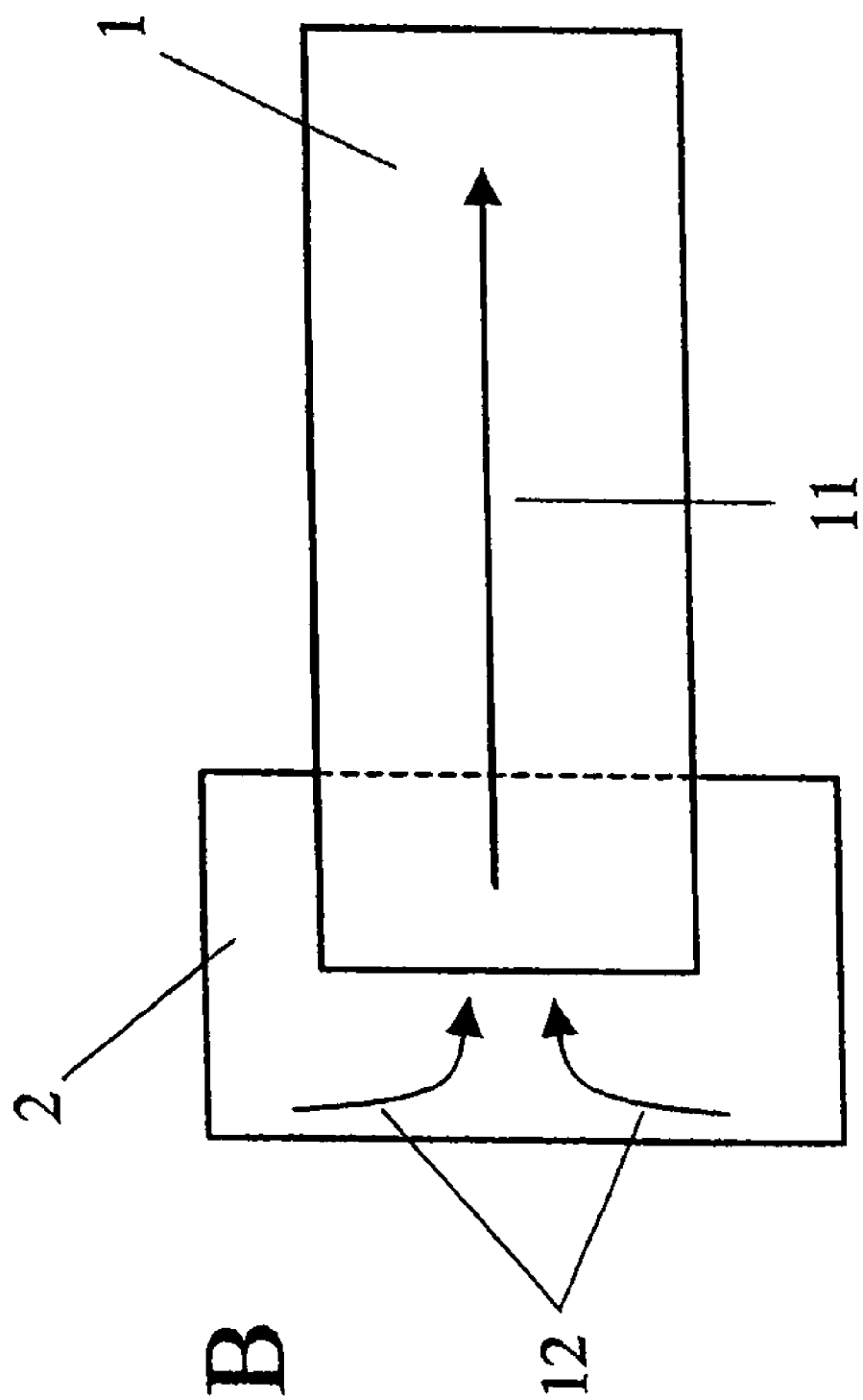
FIG. 5B illustrates that the immersion layer may occupy a portion of the plan area that the magnetic structure occupies.
Figure 5C:
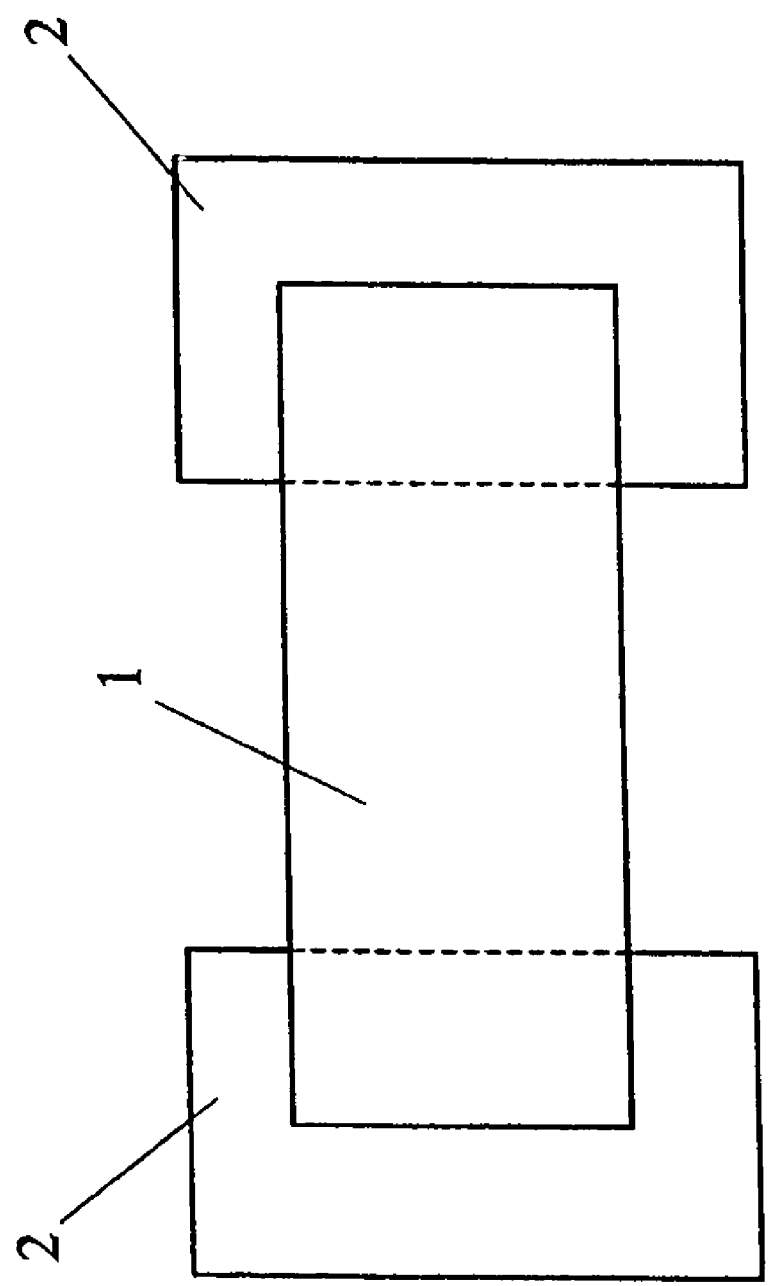
FIG. 5C shows another embodiment, wherein the immersion layer may be discontinuous, for example 2 separate pieces.
Figure 5D:
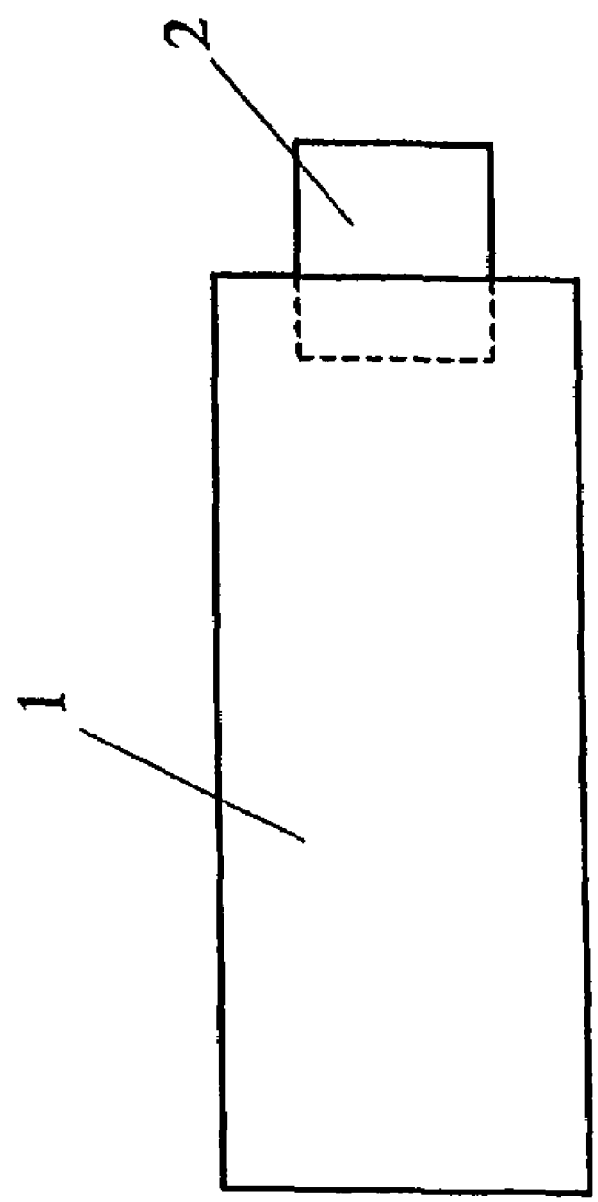
FIG. 5D shows an embodiment wherein the immersion layer may be at a single position of the magnetic structure.
Figure 5E:
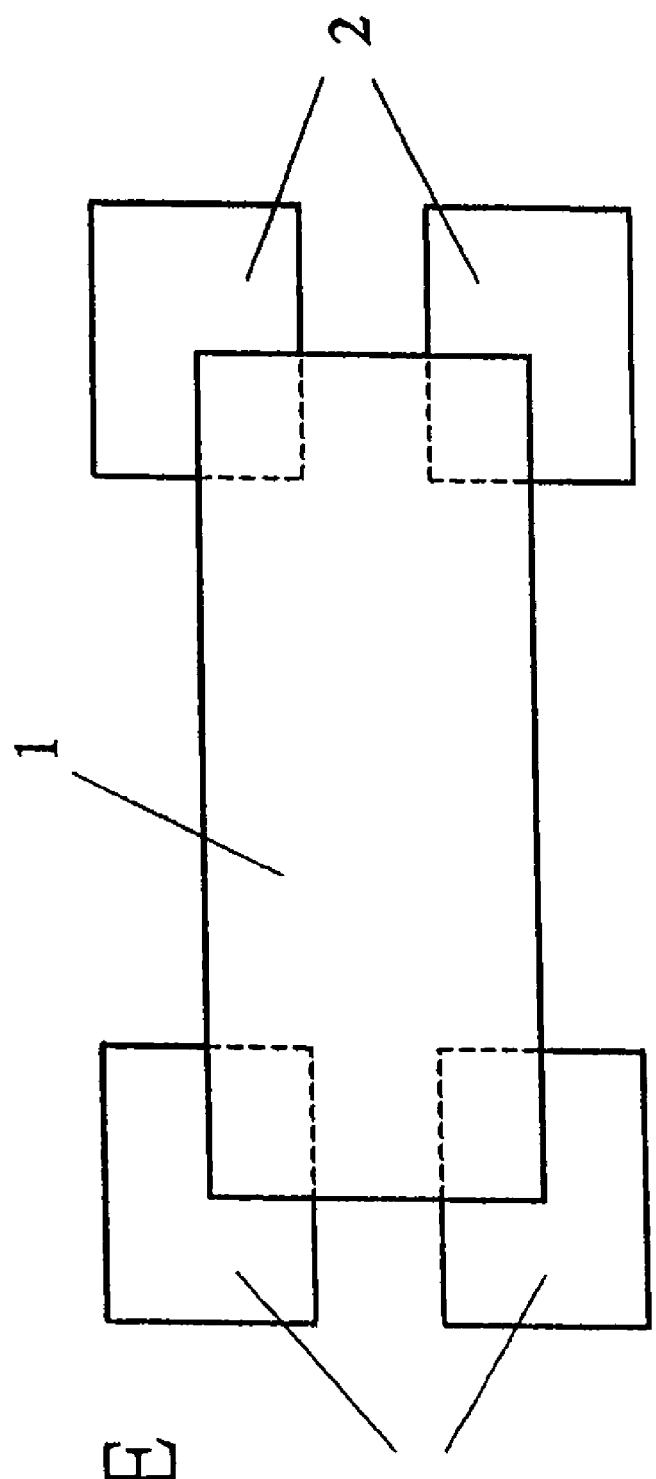
FIG. 5E shows that the immersion layer may be at several locations with respect to the magnetic structure.

In one embodiment, the thickness of 1 is greater than that of 2 though in other embodiments the thickness of 2 may be less than, may be equal to, or may be greater than 1. The size of 2 is greater than the size of 1, but in other embodiments at least one of the in-plane dimensions of 2 may be the same size or may be smaller than that of 1. Similarly, in yet another embodiment, both in-plane dimensions of 2 may be smaller than those of 1. In the preferred embodiment, 1 is placed in the geometric center of 2, however, in another embodiment 2 may be acentric with respect to 1 as in FIG. 5a. In still another, 2 may occupy a portion of the plan area that 1 occupies. An example is shown in FIG. 5b. Further, in yet other embodiments, 2 may be a discontinuous layer, for example, 2 separate pieces as in FIG. 5c, may be at a single position as in FIG. 5d, or may be at several locations as in FIG. 5e.

The invention may fully remove inhomogeneity from the cell 1 or may only partially remove it. The amount of inhomogeneity may also be controlled by the shape and geometry of both 1 and 2. The shape and/or configurationally induced anisotropy of the immersion layer 2, that is, the magneto static configuration of 2, may be at any angle compared with the shape and/or configurationally induced anisotropy of the structure 1. Further, any other anisotropies in 2, such as sputter-field induced, crystalline induced, or strain induced may have their dominant portions or symmetry directions at any angle with respect to any other anisotropies (sputter, crystalline, strain, or other) existing in 1. The inhomogeneous magnetization distribution in 2 may be any distribution whatsoever that contributes magnetostatically to increased homogeneity in cell 1 (the limiting embodiment being a distribution that perfectly induces a single domain in cell 1).

Figure 5F:
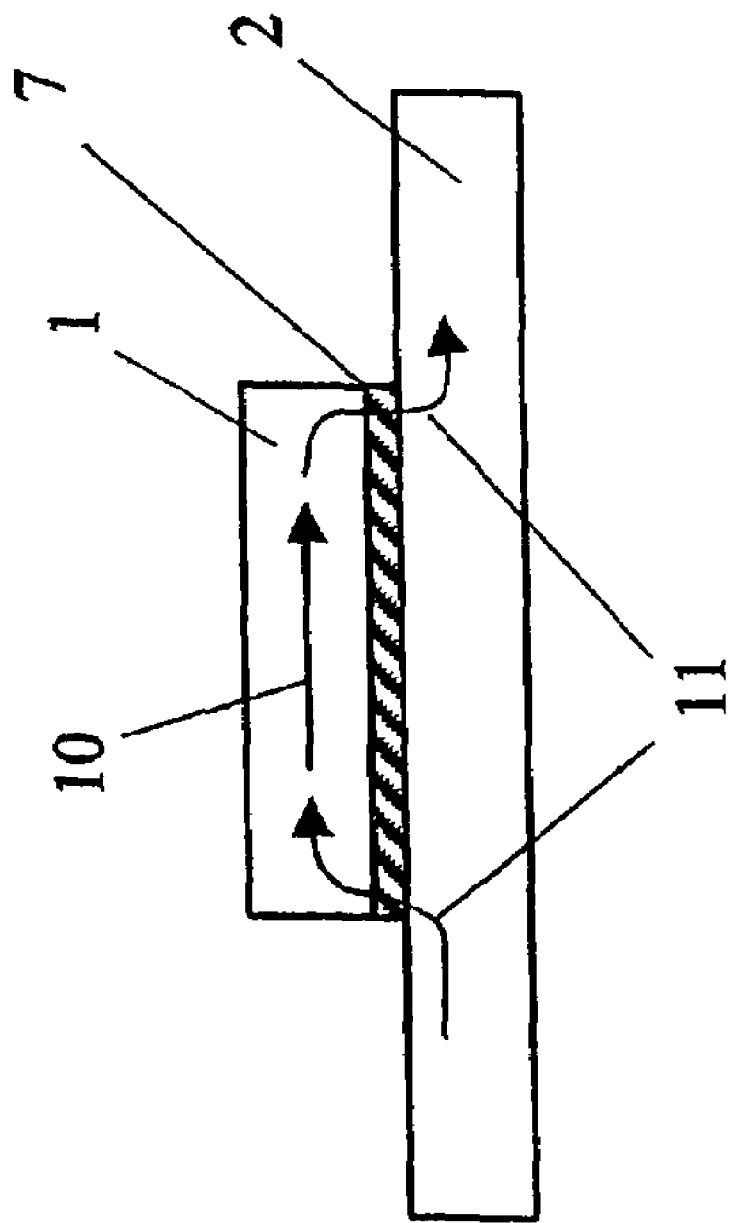
FIG. 5F shows another embodiment wherein the magnetic structure is not touching the immersion layer, but is separated by a spacer layer of nonmagnetic material, which may be conducting or insulating.

An alternative embodiment of the invention is shown in FIG. 5F. In this embodiment, the magnetic structure 1 is not touching the immersion layer 2, but is separated by a spacer layer of nonmagnetic material, either conducting or insulating. Magnetostatically, 1 is still connected with 2 and the magnetization of 2 may still arrange itself to increase the uniformity of the demagnetization fields felt spatially throughout 1 and flux may still flow between 1 and 2. In this embodiment, an additional advantage is also provided. The improved uniformity of magnetization in 1 offered by the invention may be combined with a desired choice of the exchange coupling through the spacer layer [Ref. Oscillatory coupling—Parkin, which is incorporated herein by reference in its entirety] for increased control of the magnetic behavioral properties of 1.

Figure 6A:
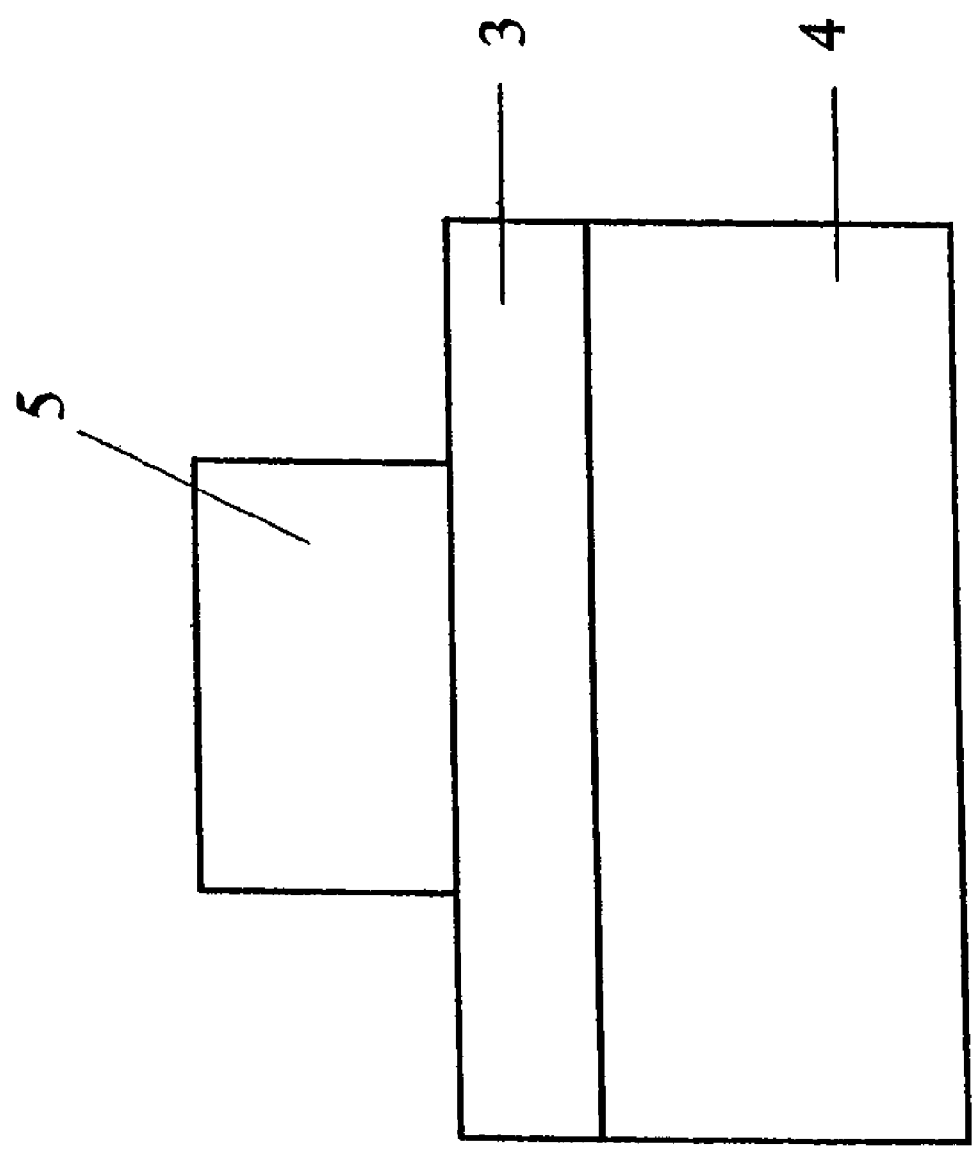
FIGS. 6A, 6B and 6C illustrate a method of fabricating devices according to embodiments of the invention, wherein the magnetic structure and the immersion layer are created out of the same thin film by subtractive etch patterning.
Figure 6B:
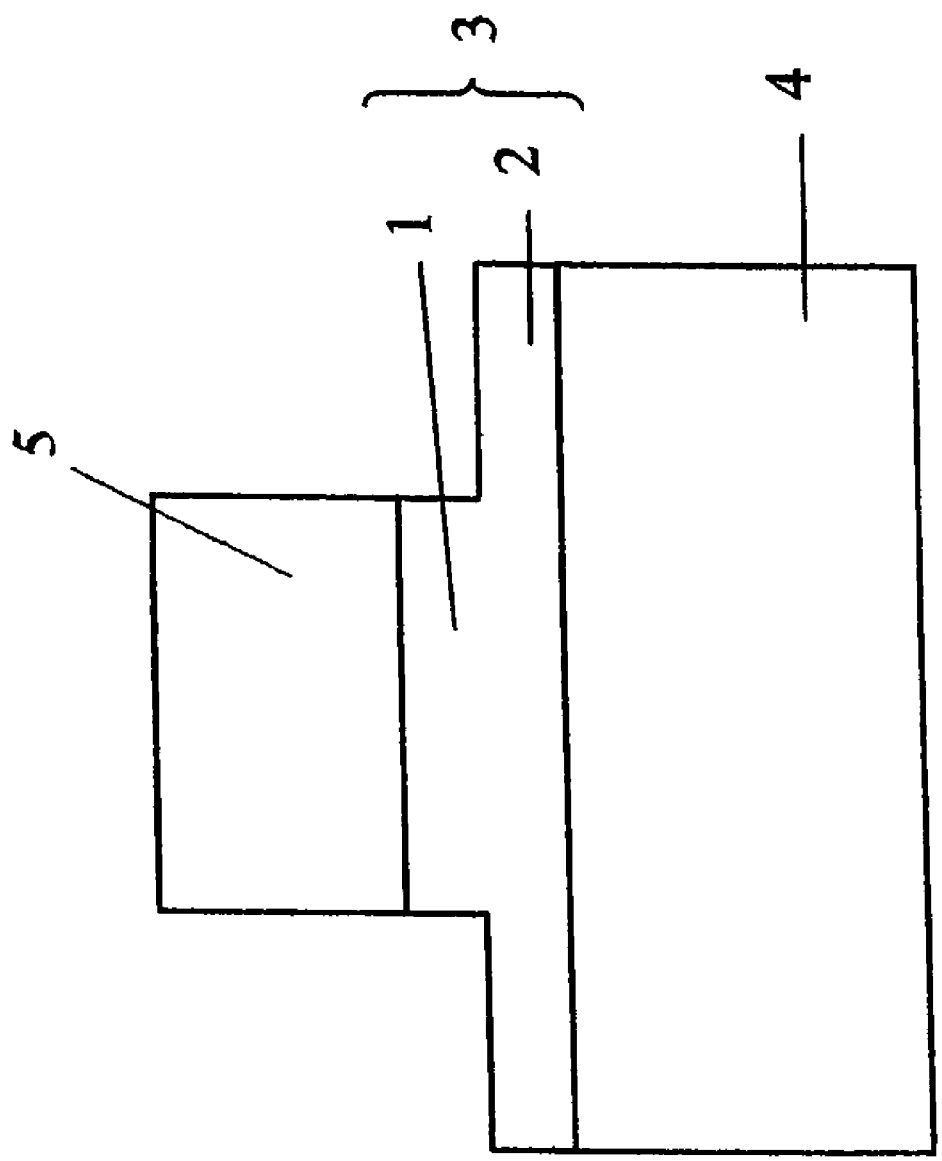
Figure 6C:
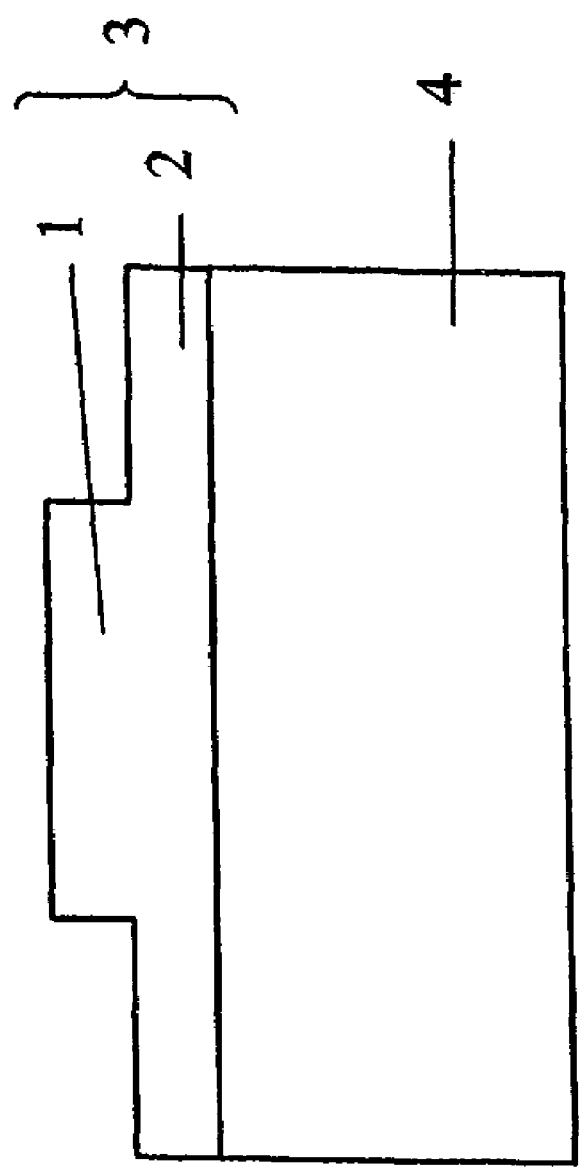

The devices disclosed in the preferred embodiments may be made by any standard microlithographic technique. In the preferred embodiment, 1 and 2 are created out of the same thin film by subtractive etch patterning, as shown in the sequence in FIGS. 6a-c. A photo resist or some other pattern transfer material 5 is located on top of a bulk magnetic film 3, on top of an existing substrate or processed substrate 4. The photo resist is in the pattern that will define area 1. The etch removal of 3 is only partially completed leaving a thinner area 2 and a defined thicker area 1. Alternatively, the film material of area 1 may be partially removed leaving area 1 as the thinner area. The subtractive etching technique may be, but is not limited to, dry ion etching, wet chemical etching, reactive ion etching. Further, e.g. but not only, the technique of liftoff may be used to form the patterned layers.

Figure 7A:
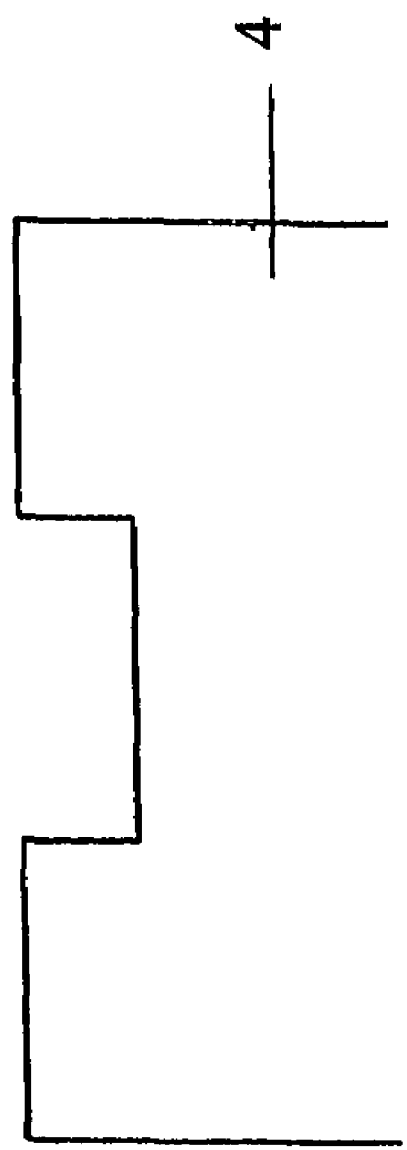
FIGS. 7A, 7B, 7C, 7D, and 7E illustrate another method of fabricating devices according to one embodiment of the present invention, as defined by an inversion process.
Figure 7B:
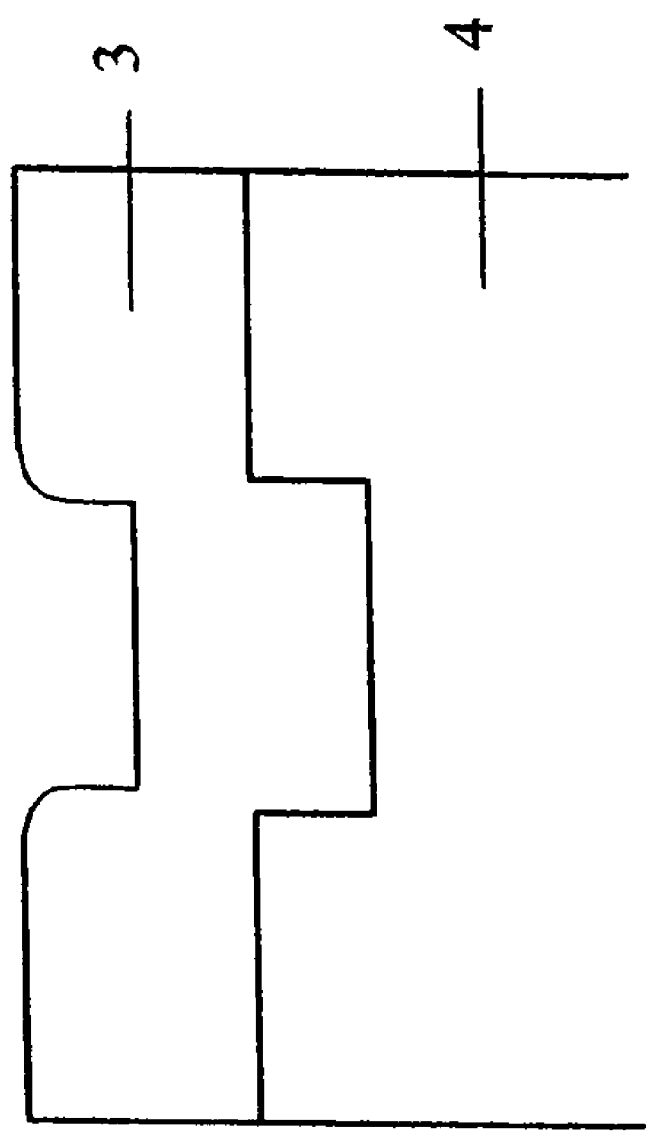
Figure 7C:
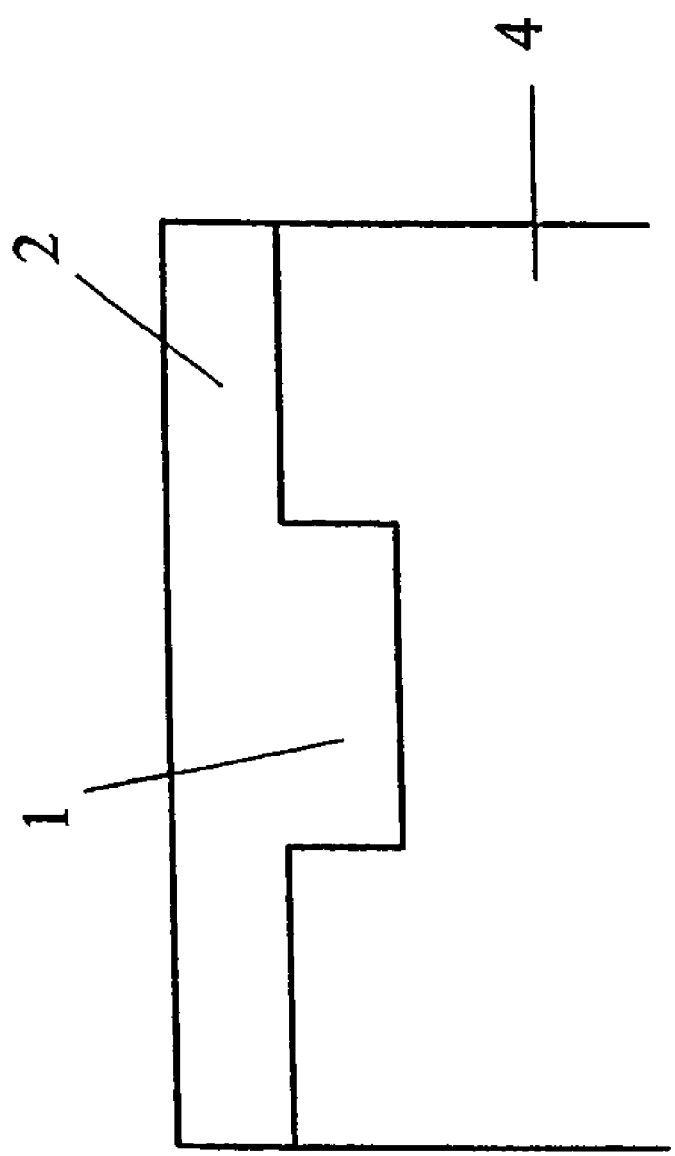

An alternative embodiment for fabrication is defined by an inversion process as in FIGS. 7a-c. A trench is etched in a substrate 4; a thick magnetic film 3 is put on top of the now topographic substrate. The film may be planarized by chemical mechanical polish or some other planarization method, to define an inverted mesa 1 in immersion film 2.

Instead of an inverted mesa, a regular mesa may be formed and the invention deposited on top and planarized, giving a thinner magnetic structure 1 than immersion layer 2. An example of a regular lattice includes a structure having a geometrical arrangement of cells over an area of the immersion layer.

Figure 7D:
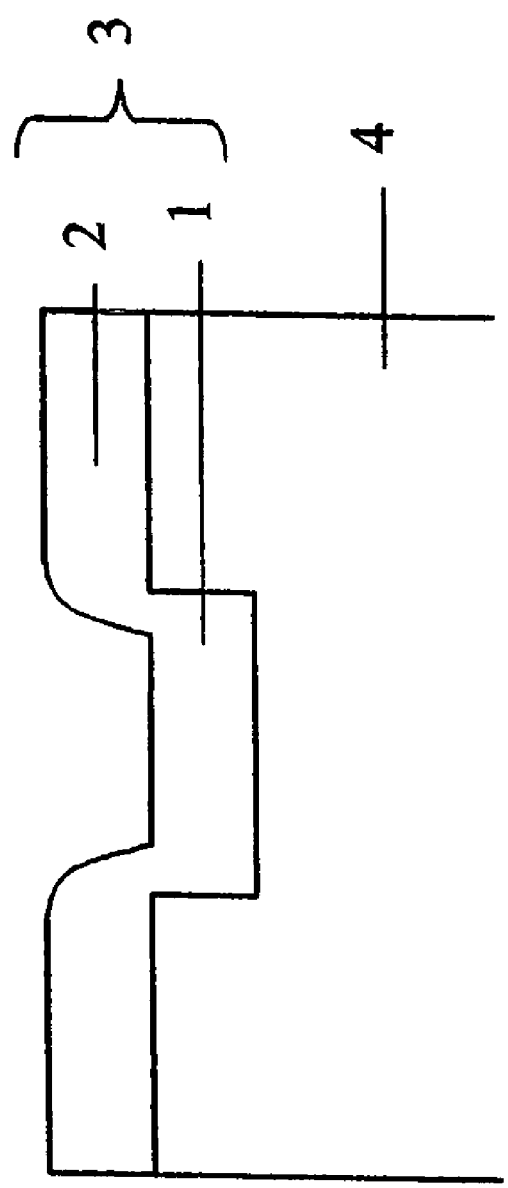
Figure 7E:
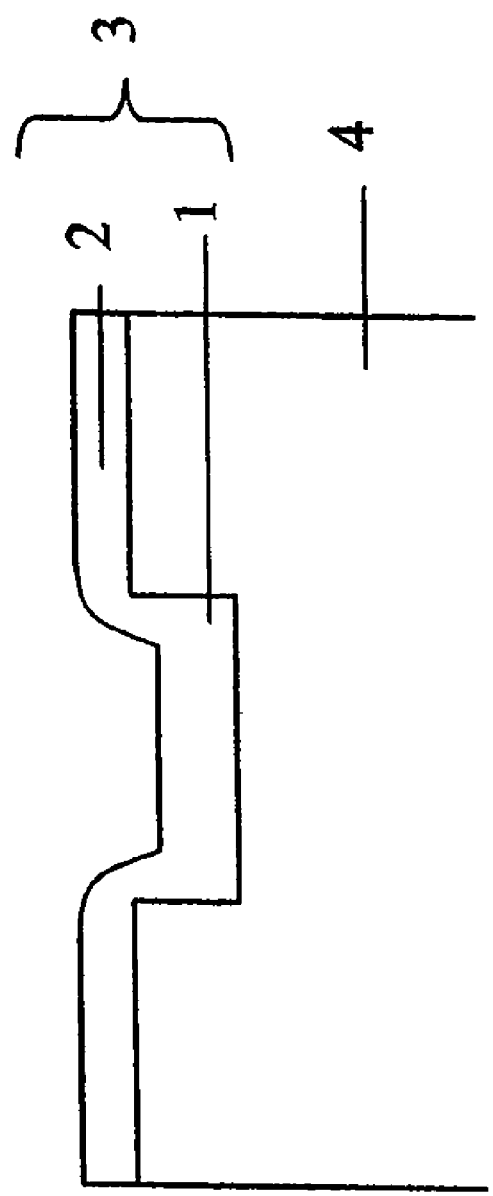
Figure 8A:
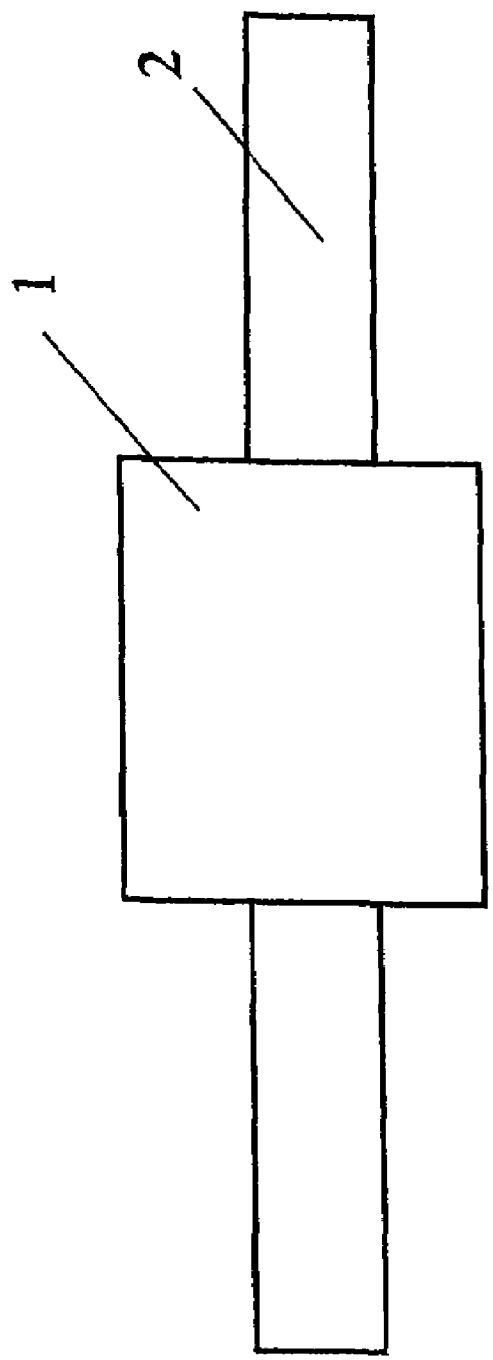
FIGS. 8A, 8B, 8C, and 8D show alternative embodiments of the invention in cross-section where the film surfaces of the magnetic structure and the immersion layer do not level with each other.
Figure 8B:
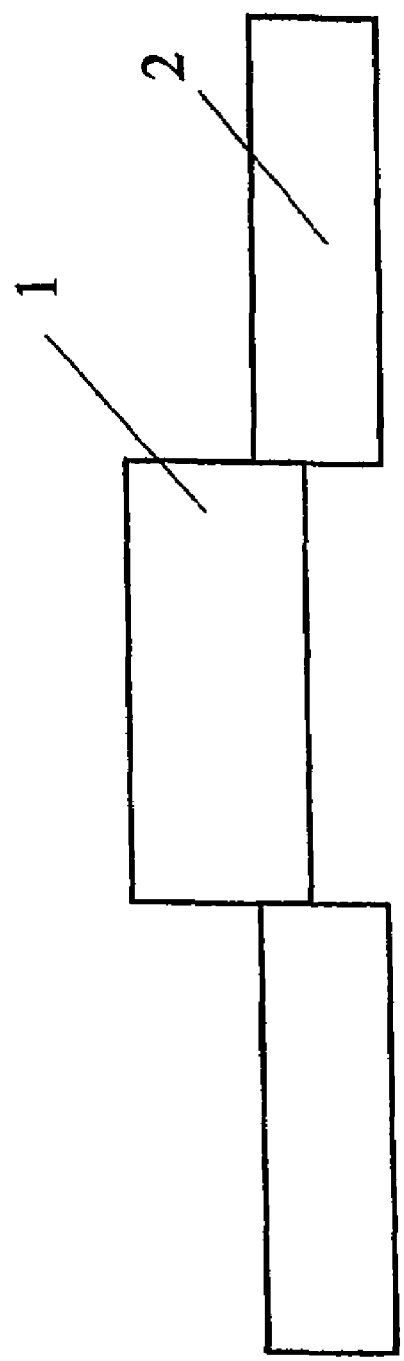
Figure 8C:
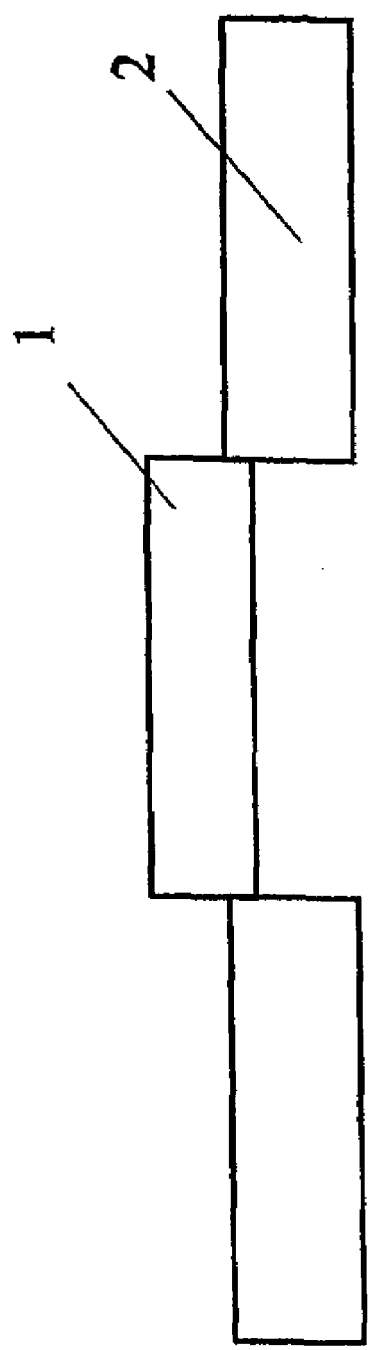
Figure 8D:
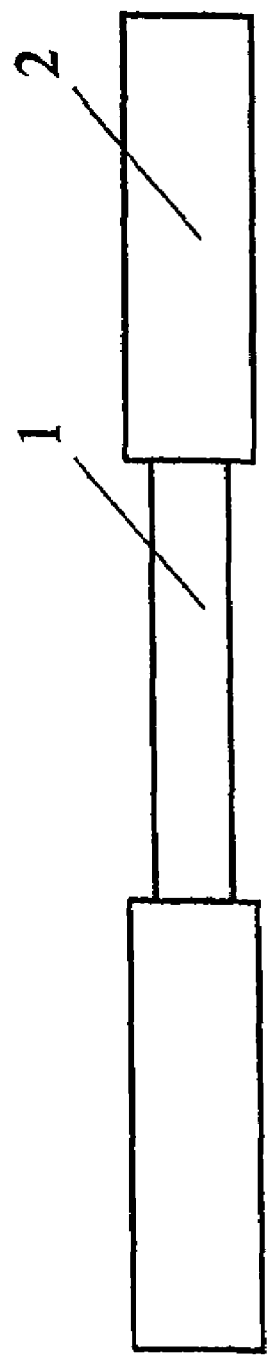

In FIG. 7*d*, an alternative process is shown in which no planarization step is needed. The film 3 of appropriate final thickness is deposited on top of the substrate 4. The trench in 4 defines the boundaries of 1 and 2. Sections 1 and 2 may be the same thickness. Alternatively, a partial planarization may be done such that 2 is thinner than 1, but not necessarily level at either surface as in FIG. 7*e*. Alternatively yet again, the inverted mesa may be a regular, non-inverted mesa.

FIGS. 8*a-d* show alternative embodiments of the invention in cross-section where the film surfaces of 1 and 2 do not have to be level with each other. Structure 1 may be thicker than 2 and extend beyond the top surface and below the bottom surface, it may be thicker and extend beyond only one of the two surfaces of 2, it may be thinner than 2 but still extend beyond one of its surfaces, or 1 may be thinner than 2 with 2 extending beyond at both surfaces.

Figure 9A:
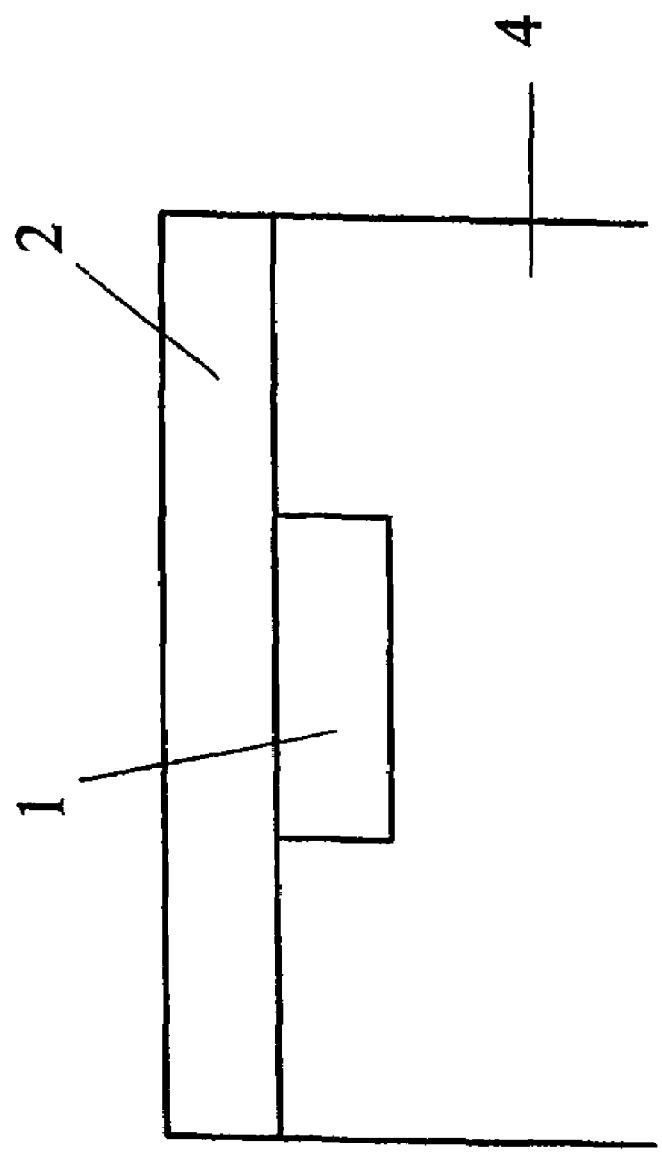
FIGS. 9A and 9B illustrate methods for the fabrication of devices according to embodiments of the present invention, using two different materials for magnetic structure and immersion layer.
Figure 9B:
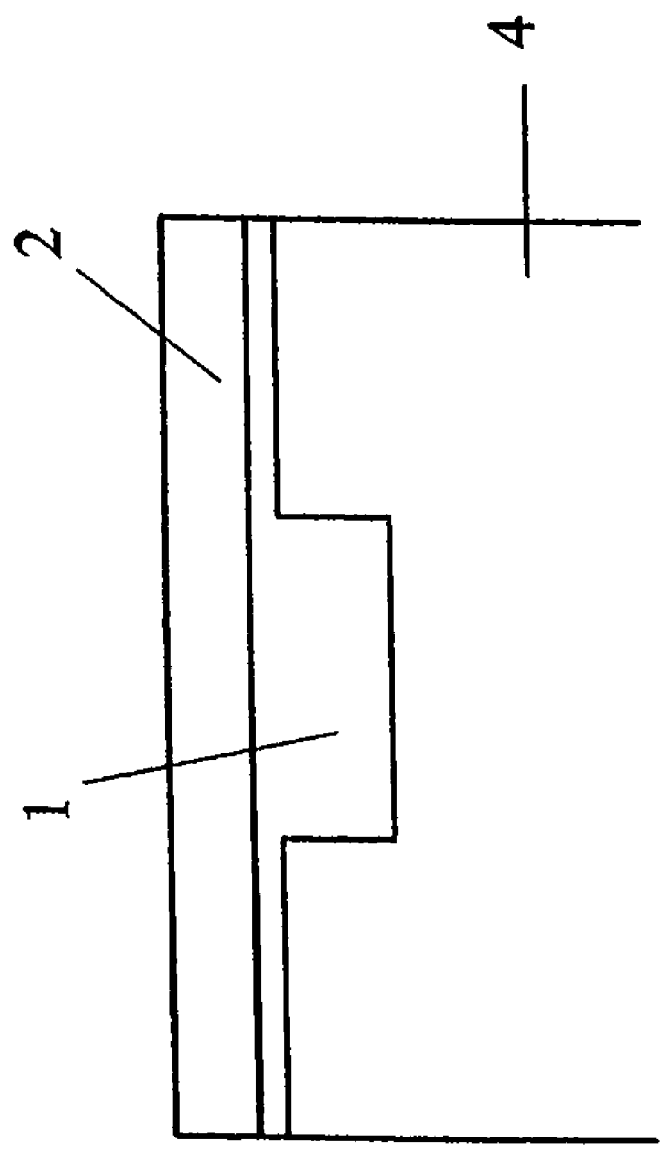

Similarly, the manufacturing processes shown in FIG. 7 may use two different materials for 1 and 2. In FIG. 7*c*, the polishing may entirely remove material 2 such that the substrate 4 is exposed. Then, a different material 2 may be deposited, as seen in FIG. 9*a*. Either of 1 or 2 may be a multilayer of magnetic material or a multilayer of a combination of magnetic and nonmagnetic material. FIG. 9*b* is an example of an embodiment with a multilayer magnetic material for 2, wherein the polishing removes most of the original material, 1 is made of the original material, and 2 consists of a double layer of material.

The invention may be incorporated into any device such as, but not only, a magnetic sensor, a magnetic recording head sensor, or a magnetic random access memory. The structure 1 may be the free (sense) layer of a multilayer magnetoresistive stack or part of the free (sense) layer of the stack or part of another magnetic layer of a multilayer stack (such as the pinned layer).

There are many benefits provided by the embodiments of the invention in a device structure. For example, an increased uniformity of the magnetization of a magnetic structure (like 1) as a free layer may allow maximum signal to be obtained via a magnetoresistive effect of 1 with a reference layer in a GMR or TMR stack. Further, the increased uniformity also contributes to a better defined dynamic behavior of a free layer. Further still, a free layer coupled to an immersion layer may have smaller magneto static coupling effects with the other layers of the magnetoresistive stack, thus, the invention may lead to reduction in the offset of the hysteresis of such devices.

Yet further still, coupling a device free layer 1 to an immersion layer 2 allows beneficial alterations in the dimension of 1. Usually, in order to keep a free layer behaving with more single domain-like behavior, the thickness has to be reduced and/or the lateral dimensions have to be increased. This is because the demagnetization fields have more effect for thicker and smaller lateral dimension structures (with the exception that, in the limit of very small lateral dimensions, exchange interaction dominates magneto static interactions). With an immersion layer 2 coupled to a free layer 1, the thickness of 1 may be increased and/or its lateral dimensions decreased while maintaining the same uniformity of demagnetization field that would occur in the thinner or larger device that was not coupled to an immersion layer. The benefits of having a smaller device are obvious (increased packing density in MRAM, for instance). The benefit of having a thicker free layer is increased thermal stability due to the increased magnetic volume. Further, contact with the immersion layer also effectively adds additional volume to the magnetic structure 1 (and, correspondingly, more thermal stability).

Figure 10A:
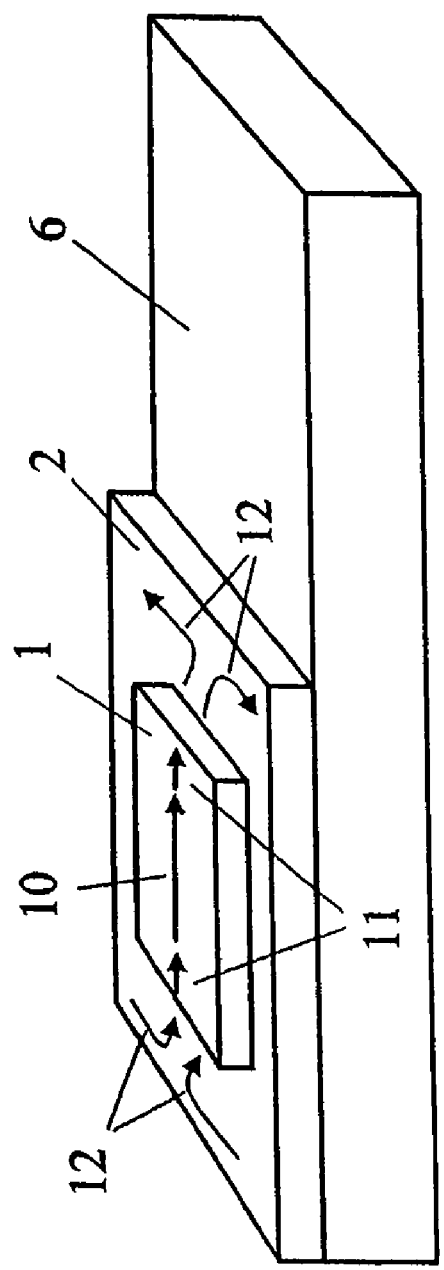
FIGS. 10A, 10B, and 10C show an embodiment of the invention in a magnetic random access memory (MRAM) cell.
Figure 10B:
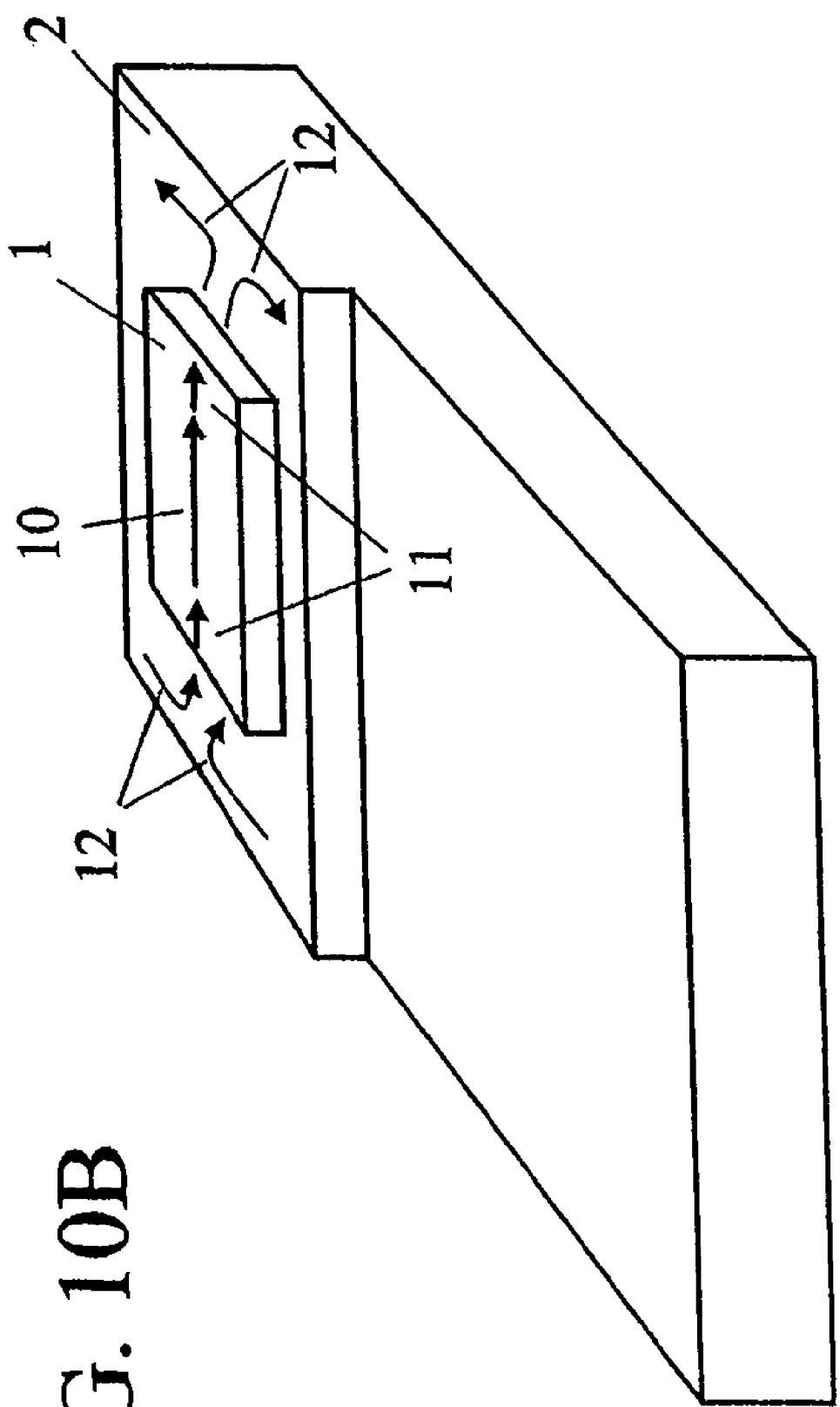
Figure 10C:
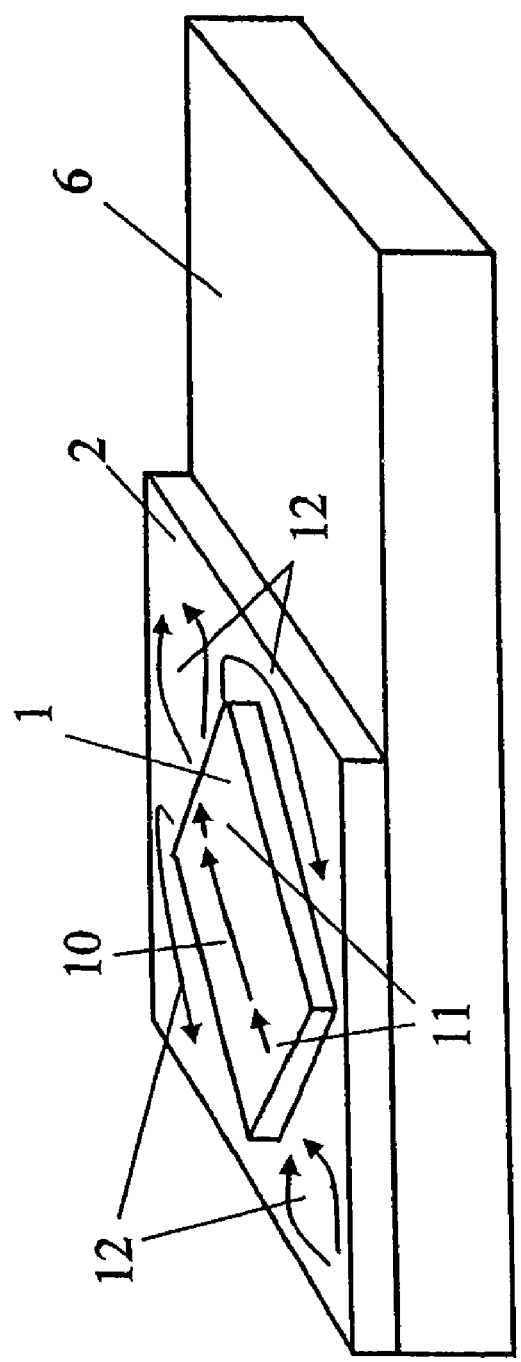

FIGS. 10*a-c* show an embodiment of the invention in a magnetic random access memory (MRAM) cell. In this embodiment, the cell 1 refers to a magneto-resistive MRAM multi-layer element such as a magnetic tunnel junction stack. In one embodiment, the cell 1 may comprise a free, soft magnetic layer or soft magnetic double layer or multi-layer (whose magnetization homogeneity is increased by the invention) adjacent to a nonmagnetic tunnel barrier, further adjacent to a pinned magnetic layer (which may be pinned by an anti-ferromagnet, an artificial anti-ferromagnet, or some other means). In another embodiment the cell may be a GMR based cell where the tunnel barrier is replaced by a nonmagnetic conductor such as Cu.

The immersion layer 2 is made nominally the same width as the current carrying word or bit line 6. It may be made in the same lithography step having the same length and width dimensions as 6 or it may have a different length and it may have a different width. The long dimension of current wire 6 may be either perpendicular or parallel to the easy axis of the MRAM cell, or at some other angle such as 45 degrees. Further, the MRAM element 1 may be of the same width as the conductor, or smaller or larger, and of any shape. The shape and/or configuration induced anisotropy of the immersion layer 2, that is, the magneto static configuration of 2, may be at any angle compared with the shape and/or configuration induced anisotropy of the cell 1. Further, any other anisotropies in 2, such as sputter-field induced, crystalline induced, or strain induced may have their dominant portions or symmetry directions at any angle with respect to any other anisotropies (sputter, crystalline, strain, or other) existing in 1. The inhomogeneous magnetization distribution 12 in 2 may be any distribution whatsoever that contributes magneto-statically to increased homogeneity of magnetization 10 in cell 1, particularly at the cell ends 11 (the limiting embodiment being a distribution that perfectly induces a single domain in cell 1).

Figure 11A:
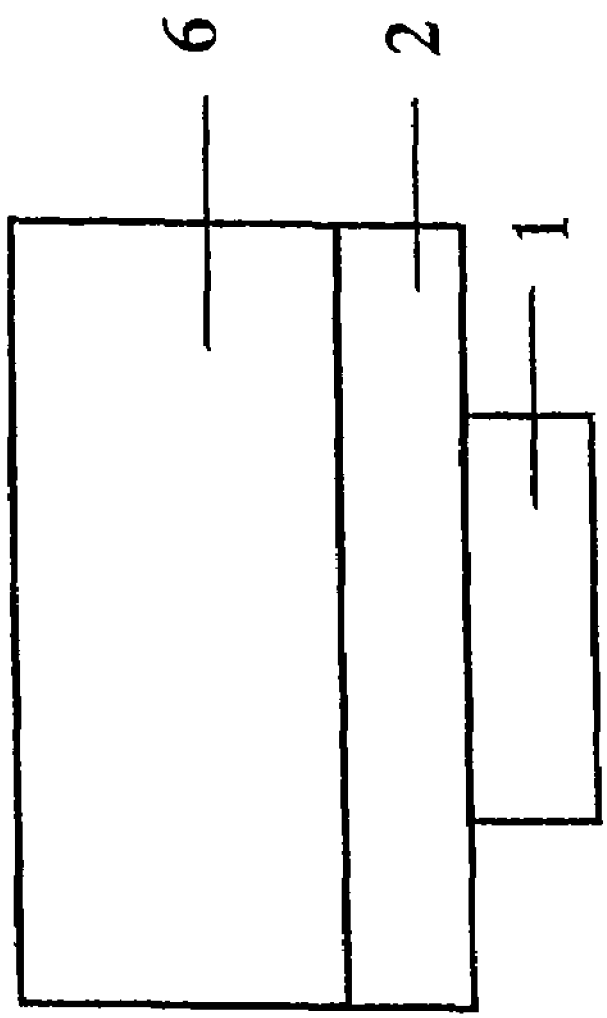
FIG. 11A and FIG. 11B show another embodiment of the present invention for an MRAM device, which has the immersion layer manufactured with the top current line.
Figure 11B:
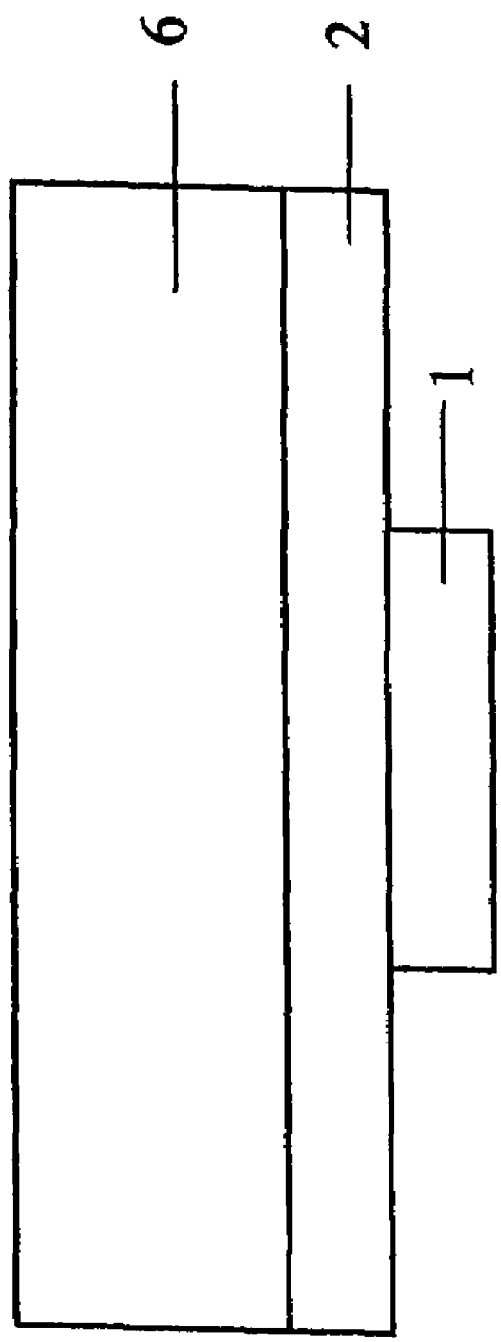

Another embodiment for an MRAM device has the immersion layer manufactured with the top current line as shown in cross-section in FIG. 11*a* and side view in FIG. 11*b*. Again, 2 may be the same or a different lateral size to the current line 6, it may exist all along the length of 6 or stop between each cell of the array, and/or it may be made in a single lithography step with 6. The MRAM cell 1 may be smaller, larger, or the same width as 6.

Figure 12A:
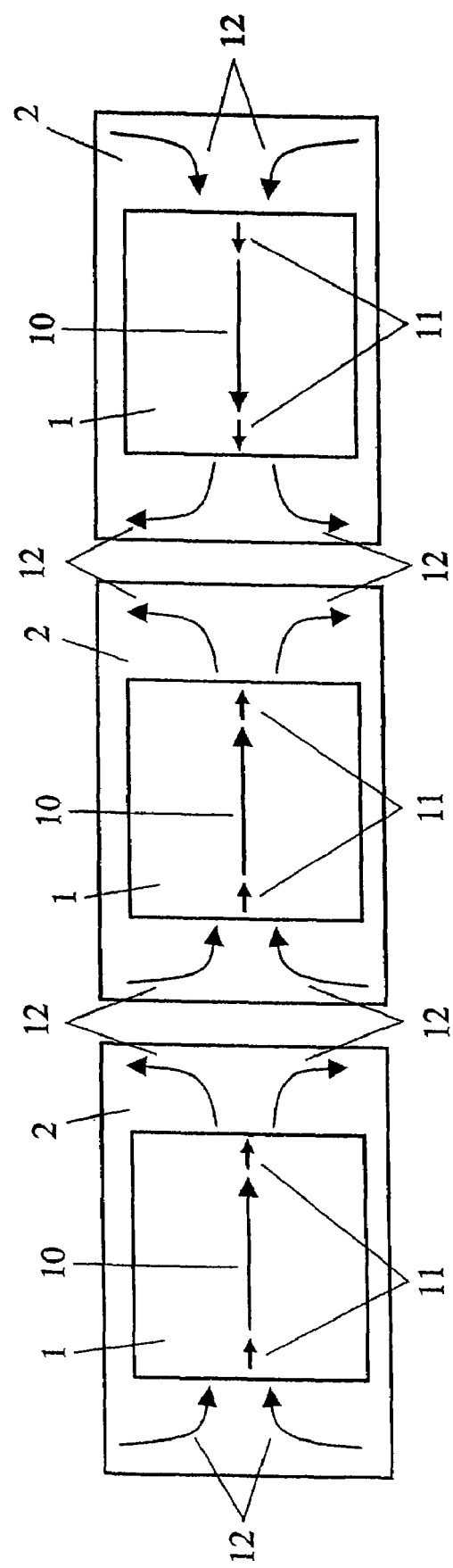

An embodiment of the array for such an MRAM device is shown in plan view in FIG. 12*a*. Here, only a few devices on a single line of the array are shown. The immersion layer may be associated with (that is, positioned next to and possibly, partially, fabricated in the same masking step) the bottom current line or the top current line (which is orthogonal to the bottom current line). Three cells 1 are shown adjacent in a line with their immersion layers 2 also shown. The current line that the immersion layer is not associated with is omitted in this view. In this embodiment, the immersion layers are disconnected. The third cell to the right points in opposite direction to the other two. The edges of the layers 2 define pinning positions to minimize cross talk between neighboring cells.

Figure 12B:
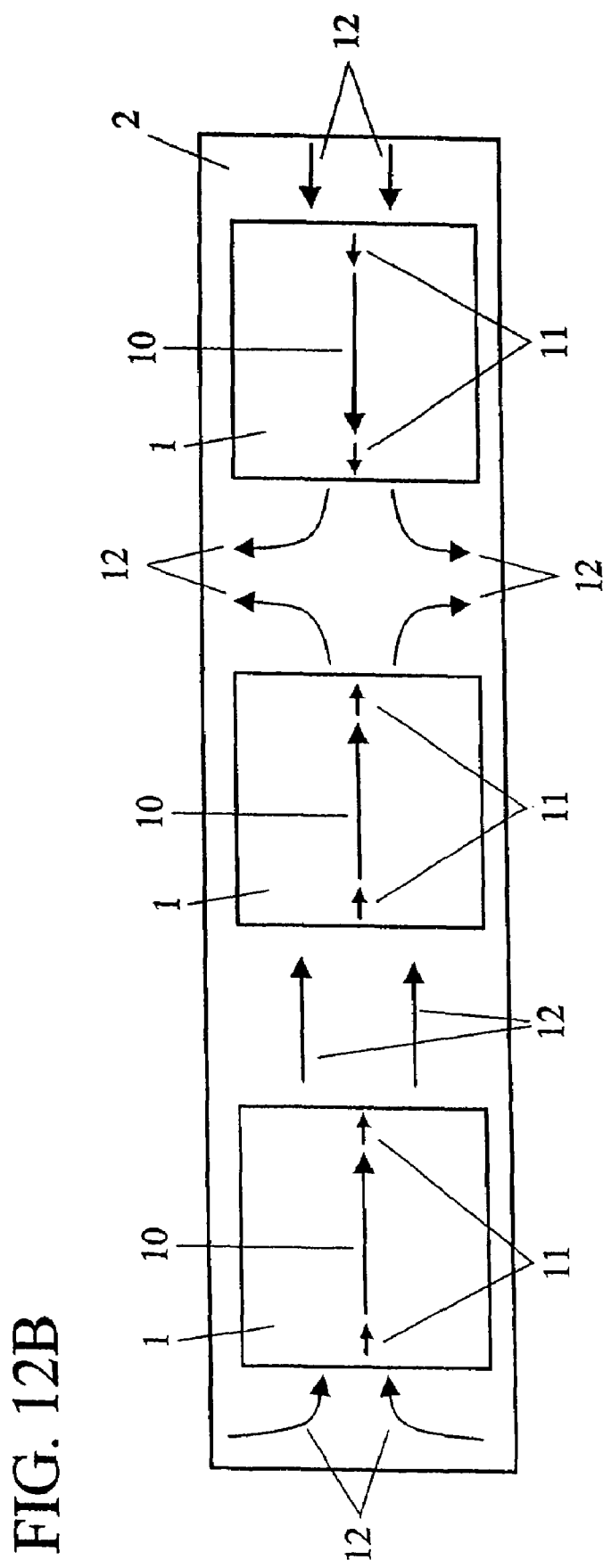

Another embodiment of such an MRAM device array is shown in plan view in FIG. 12*b*. Now, the immersion layer 2 is continuous and may be made in the same lithographic step as the current line. The area 12 between the second and third cell has extra magneto static energy due to the difference in magnetization direction between the second and third cell.

Figure 12D:
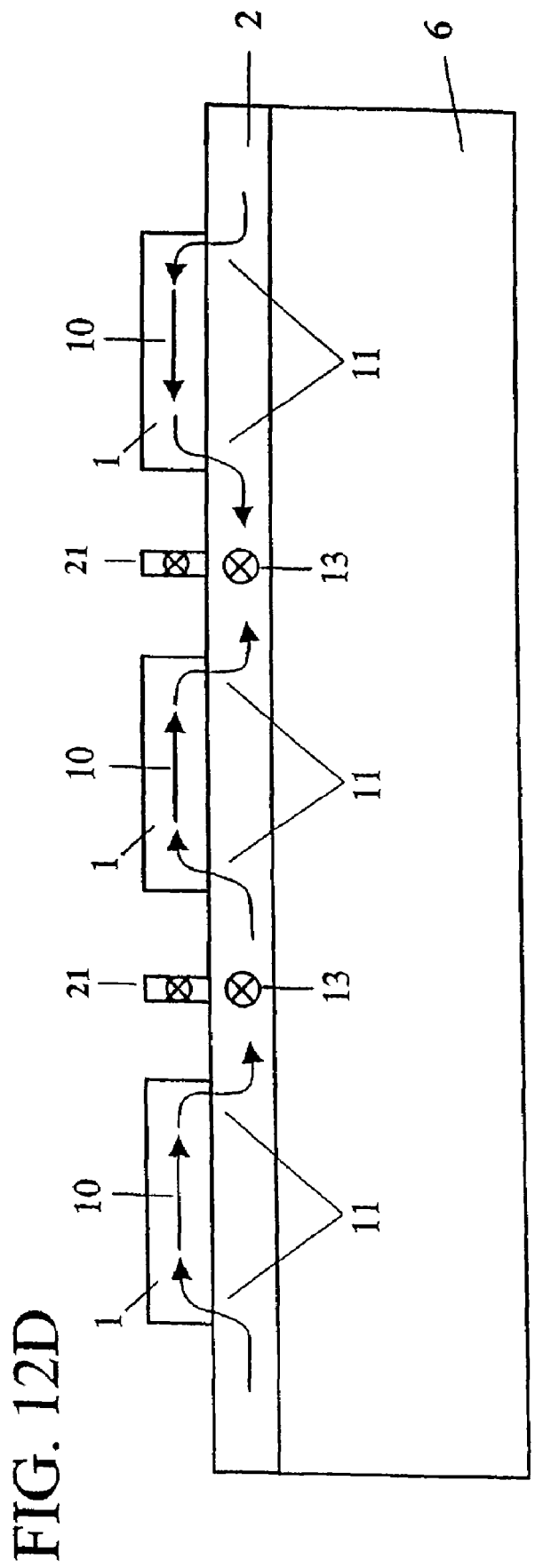

Another embodiment of such an MRAM device array is shown in plan view in FIG. 12*c* and side view in FIG. 12*d*. Magnetic cells 1 are again adjacent to a continuous immersion layer 2. Now, an additional magnetic structure 21 is added that is also magneto-statically coupled to immersion layer 2. In this case, the shape of 21 is such that the magnetization in it 13 is directed substantially perpendicular to the long dimension of the immersion layer 2 (but still in plane). It thus acts as a pinning position to minimize magneto static cross talk between neighboring cells and to pin any dynamic motions of the magnetization of the immersion layer 2. The magnetic structure 21 may be made from the same magnetic layer as 1 with a single lithographic step, though it may also be made in different steps and with different layers.

Figure 13:
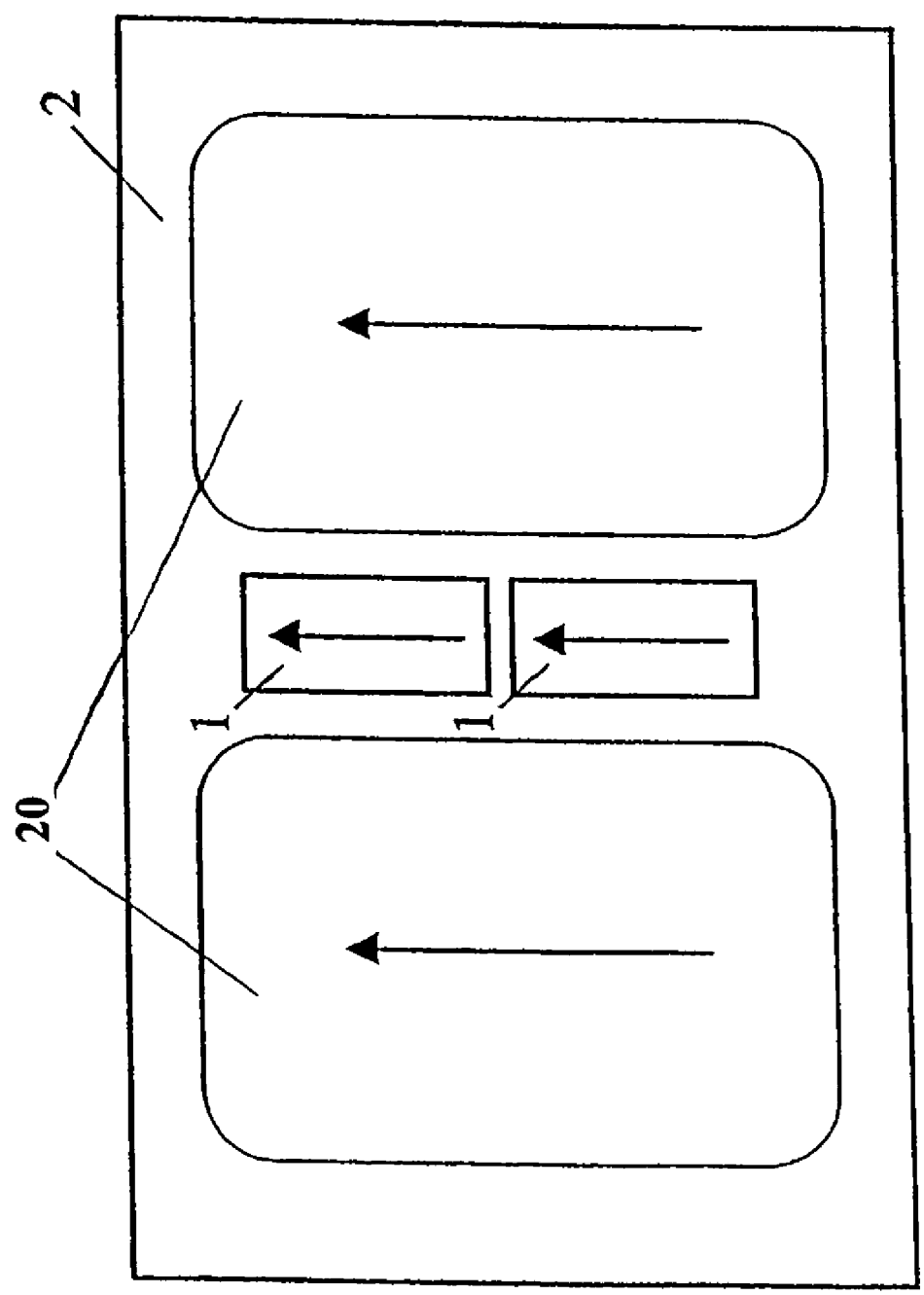
FIG. 13 shows an embodiment of the invention for application in a magnetic field sensor.

An embodiment of the invention for application to a magnetic field sensor is shown in FIG. 13. The invention is applicable to magnetic field sensor devices. In this specific embodiment, the magnetic cells 1 of the invention are present as two GMR sensing layers 1, which are part of the usual Wheatstone bridge design (not shown) with thick, soft magnetic flux guides 20 guiding the flux into the sensor area to increase sensitivity. Flux guides may comprise soft magnetic materials having a relative permeability level that is sufficient to guide flux lines to the sensor area. For instance, examples of permeability levels for known matter include air=1, Fe=150, and Py=105. Flux guides are useful in magnetic applications because they allow channeling magnetic flux in a more arbitrary manner than that provide by free space. Soft magnetic materials include a material having a magnetic permeability that is significantly higher than that of free-space, thereby allowing soft magnetic materials to conduct magnetic flux. In one embodiment, a relatively permeability level that is significantly higher than that of free space include a permeability level greater than 100. As an example, it is desirable to select a soft magnetic material with a relative permeability level of 10, 50, 100, 500, or 1000. In another embodiment, the relative permeability level of the soft magnetic material may be in the range of $10\text{-}10^6$. In an embodiment of the invention, a soft magnetic immersion layer 2 is added to either the flux guides 20, or the sensors 1, or both. The layer 2 may be in contact with 1 or only 20, or separate layers may be separately in contact with 1 and 20, or a single immersion layer 2 may contact both the flux guides and the sensors. In an embodiment, layer 2 may have an induced easy axis parallel to the flux guides parallel to the magnetization arrows shown. The sensors may have an induced easy axis perpendicular to the arrows shown, but a shape axis that dominates forcing the magnetization into the hard direction. The immersion layer 2 provides at least three benefits. (1) Uniformity and stability of the sensor with the reduction of free poles in the soft layer of the sensor. (2) The layer 2 may increase the sensitivity of the immersion layer. This may be done by effectively reducing the shape anisotropy that forces the magnetization to lie in the direction shown in zero field. Thus, smaller fields cause larger shifts in the magnetization giving increased sensitivity. If layer 2 is joined with both 20 and 1 it may also channel the flux guiding directly into the sensor, increasing its effect. Of course, an increased uniformity of the magnetization in the sensor may also contribute to increased signal since the magneto-resistance may give more signal probing the whole device rather than a portion of the device (would-be end domains) contributing only partial signal. (3) The uniformity and stability may benefit long-term reliability and stability of the sensors.

The immersion layer may be applied to the hard layer of an MR (Magneto Resistance) device, not just the soft layer. The immersion layer may improve the long-term stability of the hard layer, making it less likely to demagnetize over time (a problem of demagnetizing over time of the hard layer was cited in ('oscillatory decay of magnetization induced by domain-wall stray fields', Thomas L., Luning J., Scholl A., Nolthing F., Anders S., Stohr J., Parkin S S P, Physical-Review-Letters, vol. 84, no. 15; 10 Apr. 2000; p. 3462-5, which is incorporated herein by reference in its entirety). The embodiment of the invention may thus contain a soft cell and soft immersion layer, or a hard cell and soft immersion layer or a soft or hard cell and hard immersion layer.

Figure 14:
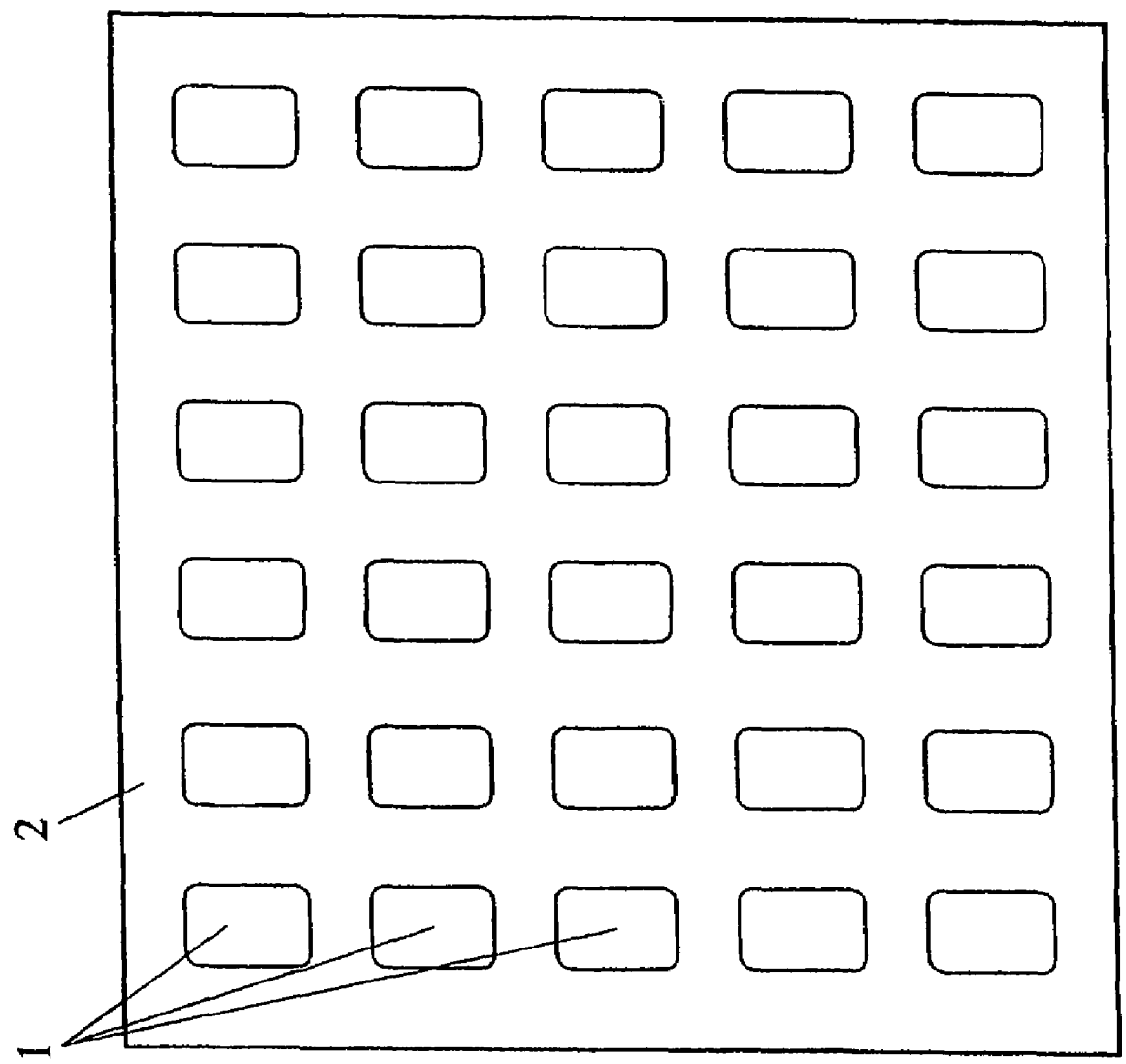
FIG. 14 shows another embodiment of the present invention, namely an array of magnetic cells immersed in a continuous immersion layer.

Another embodiment of the present invention is depicted in FIG. 14; an array of magnetic cells 1 immersed in a continuous magnetic layer 2. For some applications an array of magnetic cells may be desirable. These cells may be multi-layer MR device stacks. The immersion layer makes each cell more single domain like and its behavior closer to that of a bulk thin film. Thus, an array may be used where a bulk film property would be desired but array properties necessary (one example is MRAM). In another embodiment, the array may act together as a single sensor, covering a large area, but with the ability to engineer the behavior of the sensor more so than may be done with a bulk magnetic film. This extra ability comes from the extra engineering that may be done to the substructures such as size and shape. The embodiment in FIG. 14 may represent a locally operating sensor matrix device with each cell interrogated separately giving a spatial readout of the local magnetic field.

It is to be understood that although preferred embodiments, specific constructions and configurations, as well as materials, have been discussed herein for devices according to the present invention, various changes or modifications in form and detail may be made without departing from the scope and spirit of this invention. Accordingly, the description of preferred embodiments should not be deemed to limit the scope of the present invention.

What is claimed is:

1. A method of producing a magnetic device, the method comprising:
   depositing a first layer comprising a magnetic material on a base layer;
   defining a cell area of the first layer corresponding to a desired magnetic cell structure; and
   performing subtractive etch patterning on the first layer, except for the cell area, for only part of the thickness of the first layer,
   wherein the first layer includes an immersion layer and the magnetic cell structure is in direct contact with the immersion layer.

2. The method of claim 1, wherein the cell area is rectangular in shape.

3. The method of claim 1, wherein the cell area is elliptical in shape.

4. The method of claim 1, wherein the magnetic cell structure comprises a single magnetic domain.

5. A method of producing a magnetic device comprising a magnetic cell structure, the method comprising:
   depositing a first layer comprising a first magnetic material on a base layer;
   providing a second layer comprising a second magnetic material;
   defining a cell area of the second layer corresponding to the required magnetic cell structure; and performing subtractive etch patterning on the second layer, except for the cell area, for the entire thickness of the second layer.

6. The method as recited in claim 5, further comprising depositing a sacrificial layer comprising a non-magnetic material, and wherein the subtractive etch patterning step is performed such that at least a part of the sacrificial layer is removed.

7. The method of claim 5, wherein the cell area is defined at least in part by a photoresist positioned on the second layer.

8. The method of claim 7, wherein the subtractive etching comprises one or more of dry ion etching, wet chemical etching, or reactive ion etching.

9. The method of claim 8, wherein the first magnetic material has a first permeability and the second magnetic material has a second permeability.

10. The method of claim 9, wherein the first permeability is higher than the second permeability.

11. A method of producing a magnetic device, the method comprising:
 providing an immersion layer comprising a magnetic material on a base layer;
 defining a cell area corresponding to a required magnetic cell structure, the magnetic cell structure being in direct contact with the immersion layer; and
 performing subtractive etch patterning on the immersion layer, except for the cell area, for at least a part of the thickness of the immersion layer.

12. The method of claim 1, wherein the immersion layer is adjacent to and substantially parallel to the plane of the cell area, and wherein the immersion layer is arranged so as to provide a magnetic flux closure path in the plane of the immersion layer.

13. The method of claim 12, wherein the immersion layer comprises a permeable magnetic material.

14. The method of claim 11, wherein the immersion layer is adjacent to and substantially parallel to the plane of the cell area, and wherein the immersion layer is arranged so as to provide a magnetic flux closure path in the plane of the immersion layer.

15. The method of claim 14, wherein the immersion layer comprises a permeable magnetic material.

\* \* \* \* \*